United States Patent
Hatano et al.

(10) Patent No.: US 8,946,699 B2
(45) Date of Patent: Feb. 3, 2015

(54) DISPLAY DEVICE, LIGHT-EMITTING DEVICE, LIGHTING DEVICE, AND ELECTRONIC APPLIANCE

(75) Inventors: Kaoru Hatano, Kanagawa (JP); Satoshi Seo, Kanagawa (JP); Yoshiaki Oikawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 98 days.

(21) Appl. No.: 13/352,794

(22) Filed: Jan. 18, 2012

(65) Prior Publication Data

US 2012/0187394 A1    Jul. 26, 2012

(30) Foreign Application Priority Data

Jan. 21, 2011    (JP) ................. 2011-010380

(51) Int. Cl.

| | | |
|---|---|---|
| H01L 29/10 | (2006.01) | |
| H01L 29/12 | (2006.01) | |
| H01L 31/0216 | (2014.01) | |
| G09G 3/32 | (2006.01) | |
| H01G 9/20 | (2006.01) | |
| H01L 31/173 | (2006.01) | |
| G09G 3/34 | (2006.01) | |

(Continued)

(52) U.S. Cl.
CPC ........ *H01L 31/02162* (2013.01); *G09G 3/3208* (2013.01); *H01G 9/2068* (2013.01); *H01L 31/173* (2013.01); *G09G 3/344* (2013.01); *G02F 1/133514* (2013.01); *H01G 9/2031* (2013.01); *H01G 9/2059* (2013.01); *G09G 2300/0426* (2013.01); *Y02E 10/542* (2013.01); *Y02E 10/549* (2013.01); *G02F 1/167* (2013.01); *G02F 2001/13324* (2013.01)
USPC ..................... 257/43; 257/E31.026

(58) Field of Classification Search
USPC ........................................... 257/43
See application file for complete search history.

(56) References Cited

U.S. PATENT DOCUMENTS

| | | |
|---|---|---|
| 6,310,282 B1 | 10/2001 | Sakurai et al. |
| 6,831,408 B2 | 12/2004 | Hirano et al. |

(Continued)

FOREIGN PATENT DOCUMENTS

| | | |
|---|---|---|
| JP | 11-295725 | 10/1999 |
| JP | 2000-268891 | 9/2000 |

(Continued)

OTHER PUBLICATIONS

Nomura, K. et al, "Thin-Film Transistor Fabricated in Single-Crystalline Transparent Oxide Semiconductor," Science, vol. 300, No. 5623, May 23, 2003, pp. 1269-1272.

*Primary Examiner* — Matthew Landau
*Assistant Examiner* — Igwe U Anya
(74) *Attorney, Agent, or Firm* — Husch Blackwell LLP

(57) ABSTRACT

A light energy reuse type display device, light-emitting device, and lighting device with low power consumption, which efficiently convert light emitted from a light source (including light emission from a light-emitting element) into electric power, are provided. A photoelectric conversion element interposed between a pair of substrates functions as a color filter (a colored layer); thus, light emitted from a light source (including light emission from a light-emitting element) is efficiently converted into electric power, and a light energy reuse type display device, light-emitting device, and lighting device with low power consumption can be provided.

20 Claims, 12 Drawing Sheets

(51) Int. Cl.
*G02F 1/1335* (2006.01)
*G02F 1/167* (2006.01)
*G02F 1/133* (2006.01)

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,462,862 B2 | 12/2008 | Hoffman et al. | |
| 7,674,650 B2 | 3/2010 | Akimoto et al. | |
| 7,989,694 B2 | 8/2011 | Iwaki | |
| 8,456,459 B2* | 6/2013 | Yamazaki et al. | 345/207 |
| 8,629,472 B2* | 1/2014 | Seo et al. | 257/98 |
| 8,686,928 B2* | 4/2014 | Tanada | 345/81 |
| 2002/0047550 A1* | 4/2002 | Tanada | 315/155 |
| 2003/0218222 A1 | 11/2003 | Wager, III et al. | |
| 2004/0046184 A1 | 3/2004 | Yanagawa et al. | |
| 2004/0232413 A1* | 11/2004 | Yamazaki et al. | 257/43 |
| 2005/0001147 A1* | 1/2005 | Tanada | 250/214.1 |
| 2005/0017302 A1 | 1/2005 | Hoffman | |
| 2005/0199959 A1 | 9/2005 | Chiang et al. | |
| 2005/0218820 A1* | 10/2005 | Tanada | 315/169.3 |
| 2006/0043377 A1 | 3/2006 | Hoffman et al. | |
| 2006/0197092 A1 | 9/2006 | Hoffman et al. | |
| 2006/0273999 A1* | 12/2006 | Yamazaki et al. | 345/81 |
| 2008/0006877 A1 | 1/2008 | Mardilovich et al. | |
| 2008/0081389 A1 | 4/2008 | Matsukaze | |
| 2008/0170007 A1* | 7/2008 | Tanada | 345/76 |
| 2008/0254569 A1 | 10/2008 | Hoffman et al. | |
| 2009/0061721 A1* | 3/2009 | Isa | 445/24 |
| 2010/0066653 A1* | 3/2010 | Yamazaki et al. | 345/76 |
| 2010/0134735 A1* | 6/2010 | Nakamura et al. | 349/116 |
| 2010/0253819 A1 | 10/2010 | Yokozawa | |
| 2011/0036404 A1* | 2/2011 | Tomita | 136/258 |
| 2011/0248291 A1* | 10/2011 | Jinbo et al. | 257/88 |
| 2012/0086095 A1* | 4/2012 | Nishiyama et al. | 257/432 |
| 2012/0146025 A1* | 6/2012 | Seo et al. | 257/53 |

FOREIGN PATENT DOCUMENTS

| | | |
|---|---|---|
| JP | 2001-43980 | 2/2001 |
| JP | 2002-229472 | 8/2002 |
| JP | 4034022 B2 | 1/2008 |
| JP | 2008-107726 | 5/2008 |
| JP | 2008-164851 | 7/2008 |

* cited by examiner

DISPLAY DEVICE, LIGHT-EMITTING DEVICE, LIGHTING DEVICE, AND ELECTRONIC APPLIANCE

BACKGROUND OF THE INVENTION

1. Field of the Invention

One embodiment of the present invention relates to a light-emitting device, a lighting device, and a display device which are light energy reuse type and an electronic appliance using the light energy reuse type light-emitting device, lighting device, or display device.

2. Description of the Related Art

In recent years, as display devices, various displays such as a liquid crystal display device including a liquid crystal element, a light-emitting device including a light-emitting element utilizing electroluminescence (EL), and electronic paper using an electrophoretic element has been have been competitively developed.

The light-emitting element utilizing electroluminescence is a planar light source, and therefore is considered applicable to light sources such as backlights of liquid crystal displays, lighting devices, and the like in addition to displays, taking advantage for the feature.

On the other hand, as techniques for colored display devices, colored light-emitting devices, and colored lighting devices, a technique for providing a color filter transmitting light in a specific wavelength band emitted from a light source (including light emission from a light-emitting element) and absorbing light other than light in the specific wavelength band emitted from the light source (e.g., Patent Document 1).

However, when the color filter is used, light other than light in the specific wavelength band is absorbed by the color filter, so that there is a loss of light and light emitted from the light source cannot be used effectively. For this reason, in order to obtain desired luminance sufficiently, a loss of light needs to be compensated by light emission from the light source and the intensity of the light emission from the light source needs to be improved. Improvement of the intensity of the light emission from the light source causes a problem of an increase in power consumption as a result.

As described above, a reduction in power consumption is the common object of the display device, the light-emitting device, and the lighting device. Further, in view of current energy issues, a reduction in power consumption and effective energy use are required.

In order to achieve this object, a technique has been proposed in which a multi-colored dye-sensitized solar cell is formed over a display element (e.g., a liquid crystal element and an EL element) and the multi-colored dye-sensitized solar cell is used as a color filter to convert light energy from the display element into electric power, so that the power consumption is reduced (e.g., Patent Document 2).

REFERENCE

[Patent Document 1] Japanese Patent No. 4034022
[Patent Document 2] Japanese Published Patent Application No. 2000-268891

SUMMARY OF THE INVENTION

However, in the technique disclosed in Patent Document 2, a dye-sensitized solar cell is formed on the outer side of a display element (e.g., a liquid crystal element and an EL element), so that the dye-sensitized solar cell needs to be formed after the formation of the display element; consequently, a manufacturing process is complicated. Further, when the dye-sensitized solar cell is formed, in the case of forming the dye-sensitized solar cell directly on the display element or in the case of forming the dye-sensitized solar cell over a substrate provided with the display element, the display element, a transistor driving the display element, or the like might be broken.

In addition, in the case where the dye-sensitized solar cell is formed on the outer side of the display element, the dye-sensitized solar cell needs to be sealed with a glass substrate or the like in consideration of the reliability of the dye-sensitized solar cell; therefore, the structure is not optimal.

In view of the above problems, an object of one embodiment of the invention disclosed in this specification and the like is to provide a light energy reuse type display device, light-emitting device, and lighting device with low power consumption, in each of which a photoelectric conversion element is provided between a pair of substrates and functions as a color filter (a colored layer) so that light emitted from a light source (including light emission from a light-emitting element) is converted into electric power efficiently.

Further, an object of one embodiment of the invention is to provide an electronic appliance using the light energy reuse type display device, light-emitting device, or lighting device.

One embodiment of the invention disclosed in this specification and the like makes it possible to obtain a light energy reuse type display device, light-emitting device, and lighting device with low power consumption, in each of which a photoelectric conversion element is provided between a pair of substrates and functions as a color filter (a colored layer) so that light emitted from a light source (including light emission from a light-emitting element) is converted into electric power efficiently. Details thereof are described below.

One embodiment of the present invention is a light-emitting device including a photoelectric conversion element, a light-emitting element, and a transistor which are provided between a pair of substrates. The light-emitting element is electrically connected to the transistor. The photoelectric conversion element is provided to face the light-emitting element and includes a colored layer having a transmitting property to light emitted from the light-emitting element in a specific wavelength band. The light is emitted from the light-emitting element through the colored layer.

Further, one embodiment of the present invention is a light-emitting device including a photoelectric conversion element and a light-emitting element which are provided between a pair of substrates. The photoelectric conversion element is provided to face the light-emitting element and includes a colored layer having a transmitting property to light emitted from the light-emitting element in a specific wavelength band. The light is emitted from the light-emitting element through the colored layer.

In the above structures, the light-emitting element preferably includes an electroluminescence layer (also referred to as an EL layer).

Furthermore, one embodiment of the present invention is a display device including a light source, and a photoelectric conversion element and a display element which are provided between a pair of substrates. The photoelectric conversion element is provided to face the display element and includes a colored layer having a transmitting property to light emitted from the light-emitting element in a specific wavelength band. The light is emitted from the light source through the colored layer.

In the above structure, the display element preferably includes a liquid crystal element or an electrophoretic element.

Further, in each structure, the photoelectric conversion element preferably includes an organic thin film solar cell. The photoelectric conversion element preferably transmits at least one of red light, green light, and blue light.

In addition, one embodiment of the present invention is an electronic appliance using any of the display device, the light-emitting device, and the lighting device each of which has the above structure.

In this specification and the like, a photoelectric conversion element includes a solar cell such as a dye-sensitized solar cell, a high molecular coated type solar cell, and an organic thin film solar cell in its category.

Note that in this, specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term "electrode" or "wiring" does not limit a function of a component. For example, an "electrode" is sometimes used as part of a "wiring", and the "wiring" can be used as part of the "electrode". Moreover, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be used to denote the drain and the source, respectively, in this specification.

According to one embodiment of the present invention, it is possible to provide a light energy reuse type display device, light-emitting device, and lighting device with low power consumption, which efficiently convert light emitted from a light source (including light emission from a light-emitting element) into electric power.

Further, according to one embodiment of the present invention, it is possible to provide a highly reliable light energy reuse type display device, light-emitting device, and lighting device.

Furthermore, according to one embodiment of the present invention, it is possible to provide an electronic appliance using a light energy reuse type display device, light-emitting device, or lighting device.

DETAILED DESCRIPTION OF THE INVENTION

Figure 1A:
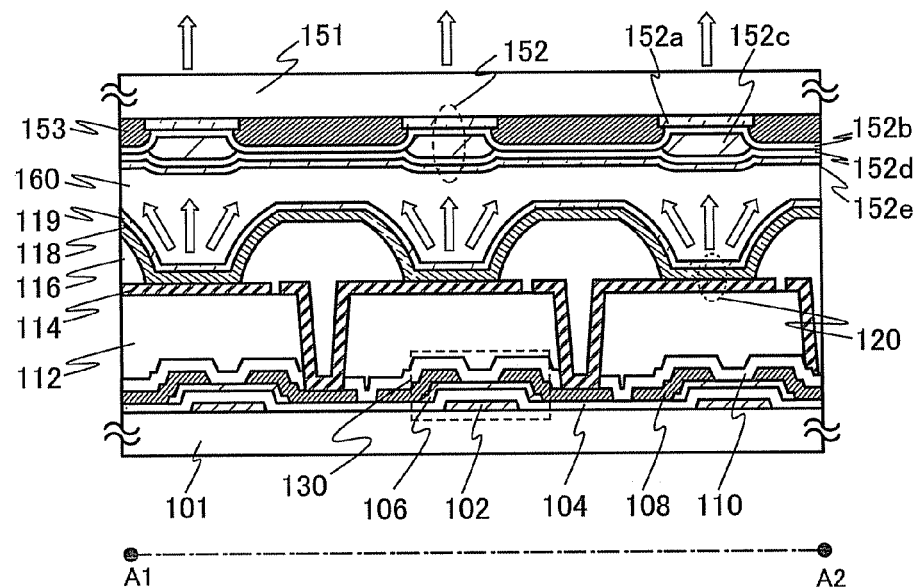
FIGS. 1A to 1C show a light-emitting device.

Embodiments will be described in detail with reference to the accompanying drawings. Note that the present invention is not limited to the embodiments described below, and it is apparent to those skilled in the art that modes and details can be modified in various ways without departing from the spirit of the present invention disclosed in this specification and the like. A structure of the different embodiment can be implemented by combination appropriately. On the description of the invention with reference to the drawings, a reference numeral indicating the same part is used in common throughout different drawings, and the repeated description is omitted.

Note that the position, the size, the range, or the like of each structure shown in the drawings and the like is not accurately represented in some cases for easy understanding. Therefore, the present invention is not necessarily limited to the position, size, range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, a structure of a light-emitting device that is one embodiment of the present invention will be described with reference to FIGS. 1A to 1C.

<Structure of Light-Emitting Device>

Figure 1B:
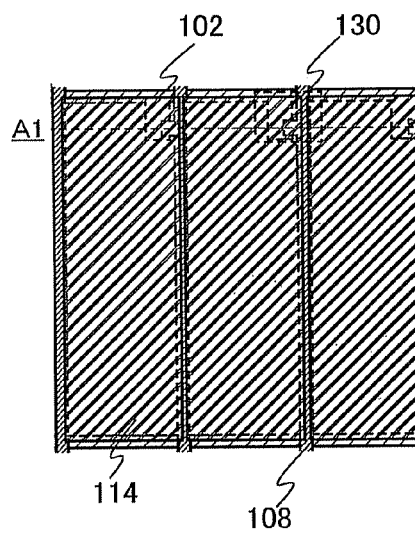
Figure 1C:
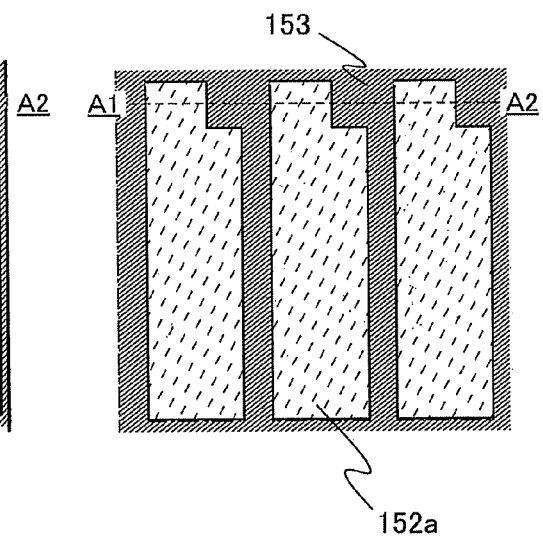

FIGS. 1A to 1C are a cross-sectional view and plan views corresponding to some pixels of a light-emitting device. Note that in this embodiment, the some pixels shown in FIGS. 1A to 1C are included in a light-emitting device.

FIG. 1A shows a cross-sectional view of the light-emitting device along lines A1-A2 in FIGS. 1B and 1C. FIG. 1B is a plan view of a first substrate 101 seen from a first electrode 114 side and FIG. 1C is a plan view of a second substrate 151 seen from a third electrode 152a side. Note that in the plan views in FIGS. 1B and 1C, some components (for example, a light-emitting element 120) of the present invention are omitted in order to avoid complex views.

The light-emitting device shown in FIG. 1A includes the first substrate 101 having a transistor 130 controlling driving of a light-emitting element, a first electrode 114 electrically connected to the transistor 130, an EL layer 118 provided over the first electrode 114, and a second electrode 119 provided over the EL layer 118, and the second substrate 151 having a light-blocking film 153 which functions as a black matrix and a photoelectric conversion element 152. A space 160 is provided between the first substrate 101 and the second substrate 151.

The light-emitting element 120 includes the first electrode 114, the EL layer 118, and the second electrode 119.

The light-emitting element 120 and the photoelectric conversion element 152 are interposed between the first substrate 101 and the second substrate 151 as described above, whereby the light-emitting element 120 and the photoelectric conversion element 152 can be sealed at the same time.

The light-emitting device shown in FIG. 1A emits light in a direction indicated by arrows shown in FIG. 1A. That is, the light-emitting device has a top-emission structure in which light is emitted not through the first substrate 101 provided with the light-emitting element 120, but through the second substrate 151.

Note that the light-emitting element 120 can also be referred to as an EL element because of including the EL layer 118. The photoelectric conversion element 152 transmits light in a specific wavelength band emitted from the light-emitting element 120 and absorbs light other than light in the specific wavelength band emitted from the light-emitting element 120, whereby light with a desired emission color is emitted to the second substrate 151 side. In addition, light absorbed by the photoelectric conversion element 152 is converted into electric power. That is, the photoelectric conversion element 152 has a function of photoelectric conversion and function of a color filter.

Here, the photoelectric conversion element 152 will be described in detail below.

The photoelectric conversion element 152 includes the third electrode 152a, a first buffer layer 152b, a colored layer 152c, a second buffer layer 152d, and a fourth electrode 152e. The first buffer layer 152b and the second buffer layer 152d at least have functions of charge transport. An inorganic compound such as LiF and TiOx, a low molecular organic compound such as copper phthalocyanine (CuPc), or a high molecular compound such as poly(3,4-ethylenedioxythiophene)/poly(styrenesulfonic acid) (PEDOT/PSS) can be used for the first buffer layer 152b and the second buffer layer 152b. An organic material can be used for the colored layer 152c. As the organic material, a variety of materials such as a mixture of a p-type semiconductor and an n-type semiconductor, a stacked film of a p-type semiconductor and an n-type semiconductor, and a copolymer of a p-type semiconductor and an n-type semiconductor, which can be separately applied to each pixel with an coated type inexpensive application apparatus by an ink jet method, a screen printing method, or the like can be used. Electric power obtained in the colored layer 152c can be extracted to the outside by the third electrode 152a and the fourth electrode 152e.

Since an organic material is used for the colored layer 152c, the photoelectric conversion element 152 can also be referred to as an organic thin film solar cell or an organic solar cell.

Note that the photoelectric conversion element 152 is not limited to the organic thin film solar cell. For example, a dye-sensitized solar cell or the like can also be used. The dye-sensitized solar cell is a liquid phase in general, so that it is difficult to use with a display element. Although there are solid phase materials for the dye-sensitized solar cell, choice of colors for the material that can be used for a color filter is small. Consequently, it is preferable to use the organic thin film solar cell as described in this embodiment.

The third electrode 152a and the fourth electrode 152e having high light-transmitting properties are used because light from the light-emitting element 120 needs to be transmitted.

The light-emitting element 120 and the photoelectric conversion element 152 are provided close to each other in such a manner, so that materials which reflect or absorb light hardly exist between the light-emitting element 120 and the photoelectric conversion element 152. That is, all light other than light entering the light-blocking film 153 enters the photoelectric conversion element 152. As shown in this embodiment, this effect can be obtained only with a combination of the light-emitting element (EL element) having a top-emission structure and the photoelectric conversion element including the organic thin film solar cell. As a result, light energy can be collected efficiently.

Note that there is no particular limitation on the space 160 between the first substrate 101 and the second substrate 151 as long as the space 160 has a light-transmitting property. It is preferable that the space 160 be filled with a transparent material the refractive index of which is higher than the air. In the case where the refractive index is low, light emitted from the light-emitting element 120 in an oblique direction is further refracted by the space 160, and light is emitted from an adjacent pixel in some cases. Therefore, for example, the space 160 can be formed with the use of a transparent adhesive having high refractive index and capable of bonding the first substrate 101 and the second substrate 151. Further, as the space 160, an inert gas or the like such as nitrogen or argon can be filled.

Further, different substrates can be used for forming the transistor 130 controlling driving of the light-emitting element 120 and the first substrate 101 provided with the light-emitting element 120, and the second substrate 151 provided with the photoelectric conversion element 152. Note that the structures of the first substrate 101 and the second substrate 151 are not limited to these. The photoelectric conversion element 152 may be formed over the first substrate 101. However, it is preferable to form the transistor 130 and the light-emitting element 120 over a substrate different from the substrate where the photoelectric conversion element 152 is formed as in the structure described in this embodiment. This is because the photoelectric conversion element 152 can be formed directly on the second substrate 151 and there is no limitation due to other materials (e.g., a material included in the light-emitting element) or steps (e.g., a heating step); therefore, the manufacturing process can be simplified. In addition, when the transistor 130 and the light-emitting element 120 can be formed over a substrate different from the substrate provided with the photoelectric conversion element 152 as described above, the incidence of defects can be low and yield can be improved.

Next, a method for manufacturing the light-emitting device shown in FIGS. 1A to 1C will be described with reference to FIGS. 2A to 2D and FIGS. 3A to 3E.

First, a method for manufacturing the first substrate 101 over which the transistor 130 controlling driving of the light-emitting element 120 and the light-emitting element 120 are formed will be described with reference to FIGS. 2A to 2D.
<Method for Manufacturing First Substrate 101>

Figure 2A:
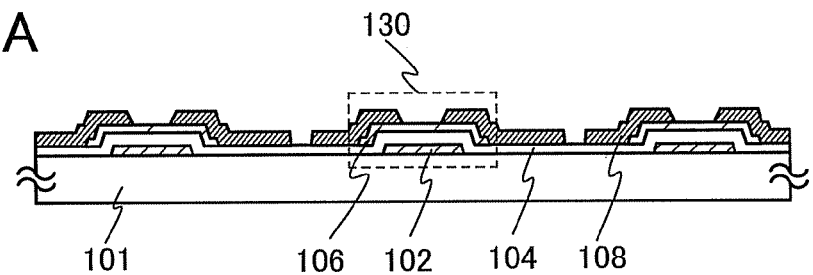
FIGS. 2A to 2D show a method for manufacturing a light-emitting device.

A conductive layer is formed over the first substrate 101 having an insulating surface, and then, a first photolithography step is performed so that a resist mask is formed. An unnecessary portion of the conductive layer is removed by etching, so that a gate electrode 102 is formed (see FIG. 2A). Etching is preferably performed so that end portions of the gate electrode 102 have tapered shapes as shown in FIG. 2A, because coverage with a film stacked thereover is improved.

Note that there is no particular limitation on a substrate which can be used as the first substrate 101; however, it needs to have at least heat resistance to withstand later heat treatment. A glass substrate can be used as the first substrate 101. When the temperature of the heat treatment performed later is high, a substrate having a strain point of 730° C. or higher is preferably used as the glass substrate. As the glass substrate, a glass material such as aluminosilicate glass, aluminoborosilicate glass, or barium borosilicate glass is used, for example. Note that by containing a larger amount of barium oxide (BaO) than boron oxide ($B_2O_3$), the glass substrate is heat-resistant and of more practical use. Therefore, a glass substrate containing BaO and $B_2O_3$ so that the amount of BaO is larger than that of $B_2O_3$ is preferably used.

Note that as the above glass substrate, a substrate formed of an insulator such as a ceramic substrate, a quartz substrate, or a sapphire substrate may be used. Alternatively, crystallized glass or the like can be used. A light-emitting device described in this embodiment has a top-emission structure in which light is extracted through the second substrate 151; therefore, a non-light-transmitting substrate such as a metal substrate or the like can be used as the first substrate 101.

An insulating film serving as a base film may be provided between the first substrate 101 and the gate electrode 102. The base film has a function of preventing diffusion of an impurity element from the first substrate 101. The base film can be formed to have a single-layer or stacked-layer structure using one or more of a silicon nitride film, a silicon oxide film, a silicon nitride oxide film, and a silicon oxynitride film.

The gate electrode 102 can be formed to have a single-layer or stacked-layer structure using a metal material such as molybdenum, titanium, chromium, tantalum, tungsten, aluminum, copper, neodymium, scandium, or the like, or an alloy material containing any of these materials as its main component.

Next, a gate insulating layer 104 is formed over the gate electrode 102 (see FIG. 2A). The gate insulating layer 104 can be formed to have a single-layer or stacked-layer structure using a silicon oxide film, a silicon nitride film, a silicon oxynitride film, a silicon nitride oxide film, or an aluminum oxide film by a plasma CVD method, a sputtering method, or the like. For example, a silicon oxynitride film may be formed using a formation gas containing $SiH_4$, $N_2O$, or the like by a plasma CVD method.

Next, a semiconductor layer is formed, and a second photolithography step and an etching step are performed thereon, so that an island-shaped semiconductor layer 106 is formed (see FIG. 2A).

The semiconductor layer 106 can be formed using a silicon semiconductor or an oxide semiconductor. As a silicon semiconductor, single crystal silicon, polycrystalline silicon, or the like can be used as appropriate. As an oxide semiconductor, an In—Ga—Zn—O-based metal oxide or the like can be used as appropriate. Note that it is preferable to use an oxide semiconductor that is an In—Ga—Zn—O-based metal oxide for the semiconductor layer 106. The oxide semiconductor that is an In—Ga—Zn—O-based metal oxide has a low off-state current and high field effect mobility; therefore, with the use of such a material for the semiconductor layer 106, an off-state leakage current of the light-emitting element formed later can be suppressed and the light-emitting element can be controlled at high speed.

Next, a conductive film is formed over the gate insulating layer 104 and the semiconductor layer 106, and source and drain electrodes 108 are formed by a third photolithography step and an etching step (see FIG. 2A).

As the conductive film for forming the source and drain electrodes 108, for example, a metal film containing an element selected from Al, Cr, Cu, Ta, Ti, Mo, and W, a metal nitride film containing any of the above-described elements as its component (a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film for forming the source and drain electrodes 108 may be formed using conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials in which silicon oxide is contained can be used.

Through the above steps, the transistor 130 controlling driving of the light-emitting element 120 can be formed (see FIG. 2A).

Figure 2B:
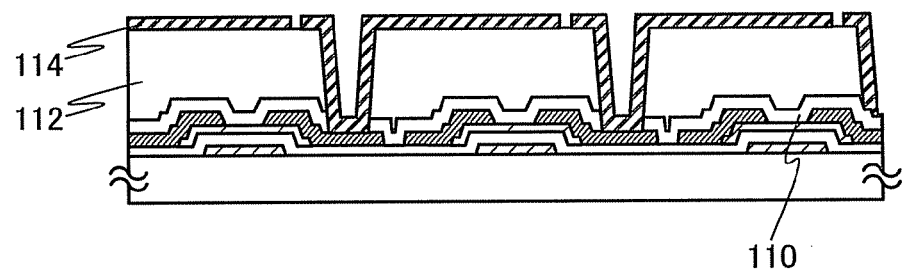

Next, a first insulating layer 110 is formed over the semiconductor layer 106 and the source and drain electrodes 108 (see FIG. 2B). As the first insulating layer 110, an inorganic insulating film such as a silicon oxide film, a silicon oxynitride film, and the like can be used.

Next, a second insulating layer 112 is formed over the first insulating layer 110 (see FIG. 2B).

As the second insulating layer 112, an insulating film with a planarization function is preferably selected in order to reduce surface unevenness due to the transistor. For example, an organic material such as polyimide, acrylic, benzocyclobutene, or the like can be used. Other than such organic materials, it is also possible to use a low-dielectric constant material (a low-k material) or the like. Note that the second insulating layer 112 may be formed by stacking a plurality of insulating films formed using any of these materials.

Next, by a fourth photolithography step and an etching step, an opening which reaches the source and drain electrodes 108 is fondled in the second insulating layer 112 and the first insulating layer 110. As a method for forming the opening, dry etching, wet etching, or the like may be selected as appropriate.

Next, a conductive film is formed over the second insulating layer 112 and the source and drain electrodes 108, and then, the first electrode 114 is formed by a fifth photolithography step and an etching step (see FIG. 2B).

As the first electrode 114, a material which reflects light emitted from the EL layer 118 (to be formed later) efficiently is preferable. This is because the light-extraction efficiency can be improved. Note that the first electrode 114 may have a stacked-layer structure. For example, as the first electrode 114, a stacked-layer structure can be used in which a conductive film of metal oxide, a titanium film, or the like is formed thin on the side which is in contact with the EL layer 118 including a light-emitting substance, and a metal film (aluminum, an alloy of aluminum, silver, or the like) having high reflectance is formed thereover. Such a structure is preferable because the formation of an insulating film between the EL layer 118 and a metal film (aluminum, an alloy of aluminum, silver, or the like) having high reflectance can be suppressed.

Figure 2C:
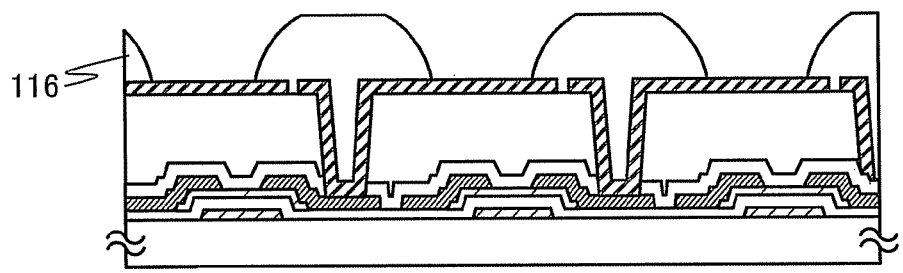

Next, a partition 116 is formed over the first electrode 114 (see FIG. 2C).

An organic insulating material or an inorganic insulating material is used to form the partition 116. It is particularly preferable that the partition 116 be formed using a photosensitive resin material to have an opening over the first electrode 114 and a sidewall inclined with continuous curvature.

Figure 2D:
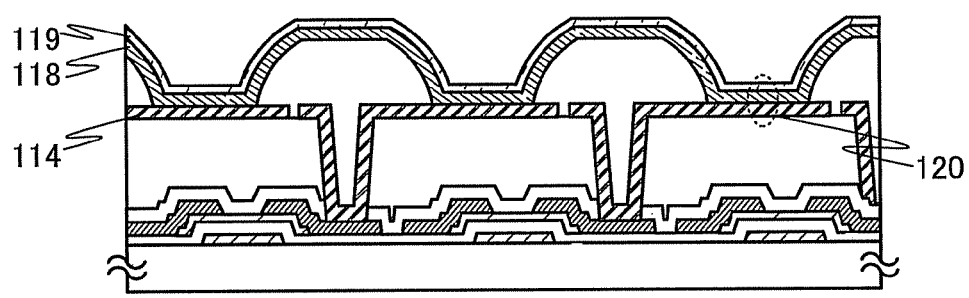

Next, the EL layer 118 is fanned over the first electrode 114 and the partition 116 (see FIG. 2D). The EL layer 118 may have a single-layer structure or a stacked-layer structure. In either case, it is preferable for the EL layer 118 to emit white light having peaks in each of red, green, and blue wavelength regions.

Next, the second electrode 119 is formed over the EL layer 118 (see FIG. 2D).

Note that one of the first electrode 114 and the second electrode 119 functions as an anode of the light-emitting element 120, and the other functions as a cathode of the light-emitting element 120. It is preferable to use a substance having a high work function for the electrode which functions as an anode, and a substance having a low work function for the electrode which functions as a cathode.

Through the above steps, the first substrate 101 provided with the transistor 130 controlling driving of the light-emitting element 120 and the light-emitting element 120 is formed.

Next, a method for manufacturing the second substrate 151 over which the photoelectric conversion element 152 and the light-blocking film 153 functioning as a black matrix are formed will be described with reference to FIGS. 3A to 3E.

<Method for Manufacturing Second Substrate 151>

Figure 3A:
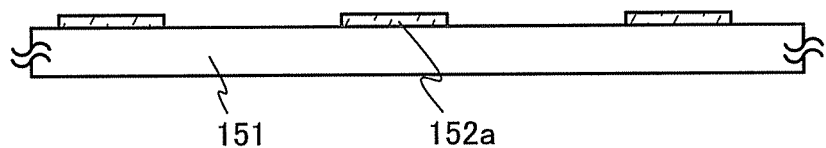
FIGS. 3A to 3E show a method for manufacturing a light-emitting device.

First, the third electrode 152a is formed over the second substrate 151 (see FIG. 3A).

A conductive film transmitting visible light is used for the third electrode 152a. As the conductive film transmitting visible light, for example, indium oxide ($In_2O_3$), tin oxide ($SnO_2$), zinc oxide (ZnO), ITO, indium oxide-zinc oxide alloy ($In_2O_3$—ZnO), or any of these metal oxide materials in which silicon oxide is contained can be used. Further, a metal thin film having a thickness enough to transmit light (preferably, approximately 1 nm to 30 nm) can also be used.

Figure 3B:
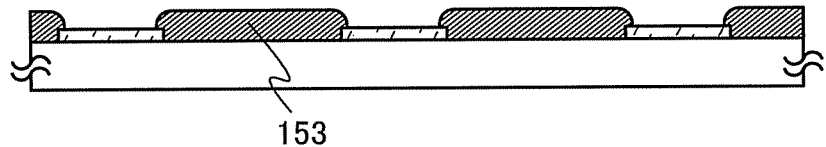

Next, the light-blocking film 153 is formed over the second substrate 151 and the third electrode 152a (see FIG. 3B). The light-blocking film 153 is provided so that colors of pixels do not mix. The light-blocking film 153 functions as a so-called black matrix.

Any film can be used as the light-blocking film 153 as long as the film can block light emitted from the light-emitting element 120. A metal film, an organic resin film including black dye or a black pigment, or the like can be used for the light-blocking film 153. Note that here, the method in which the light-blocking film 153 is formed after the formation of the third electrode 152a is described as an example; however, the present invention is not limited thereto. For example, the light-blocking film 153 may be formed before the formation of the third electrode 152a or the light-blocking film 153 is not necessarily formed.

Figure 3C:
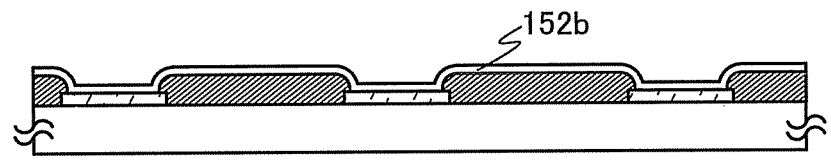

Next, the first buffer layer 152b is formed over the third electrode 152a and the light-blocking film 153 (see FIG. 3C).

The first buffer layer 152b at least has a function of charge transport. An inorganic compound such as LiF and TiOx, a low molecular organic compound such as copper phthalocyanine (CuPc), or a high molecular organic compound such as poly(3,4-ethylenedioxythiophene)/poly(styrenesulfonic acid) (PEDOT/PSS) can be used for the first buffer layer 152b. A screen printing method, an ink jet method, an evaporation method, a spin coating method, a cast method, a sputtering method, a plasma CVD method, or the like can be appropriately used for forming the first buffer layer 152b.

Figure 3D:
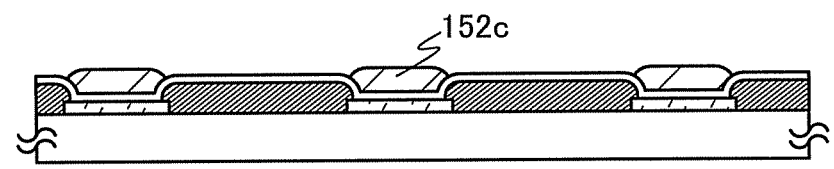

Next, the colored layer 152c is formed over the first buffer layer 152b (see FIG. 3D).

In this embodiment, the colored layer 152c including any of three colors of red (R), green (G), and blue (B) is described; however, the present invention is not limited thereto. For example, the colored layer 152c including any of four colors of R, G, B, and yellow (Y) or more may be used. Note that when an emission spectrum is not in a desired region with the use of only one kind of material, two or more kinds of materials may be combined.

The colored layer 152c can be formed by applying a mixture of a p-type semiconductor and an n-type semiconductor with the use of an ink jet method, a screen printing method, or the like. In addition, each color of R, G, and B can be a desired color by adjusting absorption spectrums of the p-type semiconductor and the n-type semiconductor. As a material that can be applied, a polymer material, a low molecular material that is soluble in a solvent, a dye material part of which is substituted by a colorless polymer side chain can be used. An example of a specific method for manufacturing a material that can be used for the colored layer 152c will be described below.

<Method for Manufacturing Red (R) Colored Layer>

As the p-type semiconductor, polyfluorene (abbreviation: PFO, see a structural formula (A-1)) can be used and as the n-type semiconductor, N,N'-Dihexylperylene-3,4,9,10-tetracarboxylic diimide (abbreviation: HexPTC, see a structural formula (A-2)) can be used. When PFO (abbreviation) and HexPTC (abbreviation) are dissolved in a solvent such as toluene, chloroform, dichloroethane, or chlorobenzene and applied, a red (R) colored layer formed of a mixture of the p-type semiconductor and the n-type semiconductor can be formed.

[Chemical Formula 1]

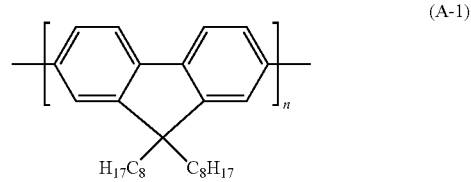

(A-1)

[Chemical Formula 2]

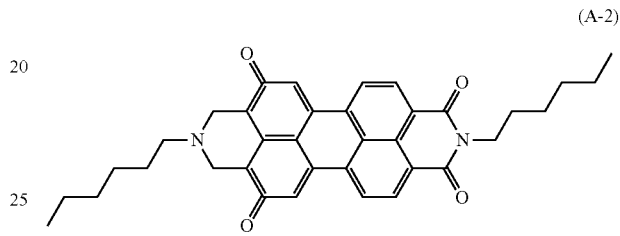

(A-2)

<Method for Manufacturing Green (G) Colored Layer>

As the p-type semiconductor, vanadium phthalocyanine substituted by a phenoxy group (abbreviation: Pho-VoPc, see a structural formula (A-3)) can be used and as the n-type semiconductor, [6,6]-phenyl-C61 butyric acid methyl ester (phenyl-C61 butyric acid methyl ester) (abbreviation: PCBM, see a structural formula (A-4)) can be used. When Pho-VoPc (abbreviation) and PCBM (abbreviation) are dissolved in a solvent such as toluene, chloroform, dichloroethane, or chlorobenzene and applied, a green (G) colored layer formed of a mixture of the p-type semiconductor and the n-type semiconductor can be formed.

[Chemical Formula 3]

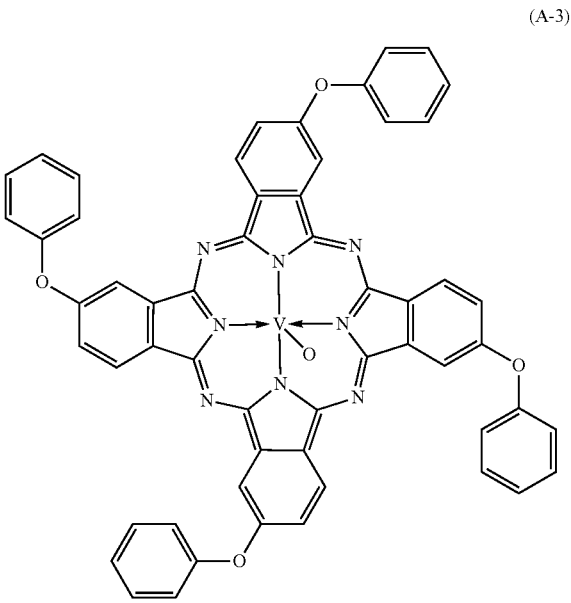

(A-3)

[Chemical Formula 4]

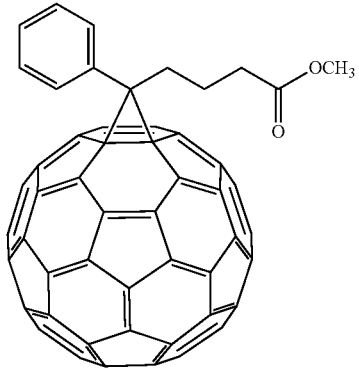

(A-4)

[Chemical Formula 6]

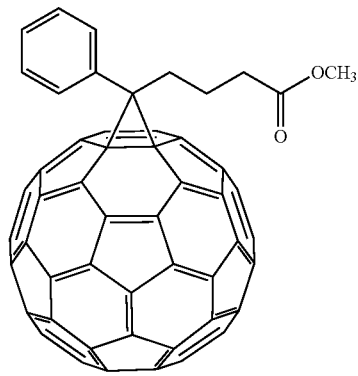

(A-4)

<Method for Manufacturing Blue (B) Colored Layer>

As the p-type semiconductor, a dielectric substance of CuPc (see a structural formula (A-5)) in which a substituent (in this embodiment, t-Bu) is introduced into copper, phthalocyanine (abbreviation: CuPc) that is a general blue pigment so as to dissolve in a solvent can be used. As the n-type semiconductor, PCBM (abbreviation) (see the structural formula (A-4)) is used. When the dielectric substance of CuPc and PCBM (abbreviation) are dissolved in a solvent such as toluene, chloroform, dichloroethane, or chlorobenzene and applied, a blue (B) colored layer formed of a mixture of the p-type semiconductor and the n-type semiconductor can be formed.

[Chemical Formula 5]

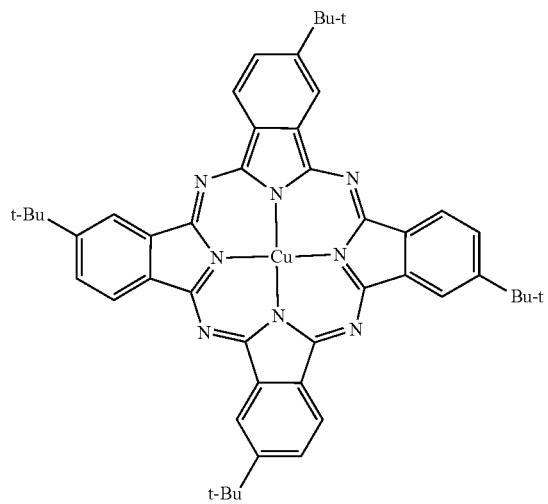

(A-5)

Without limitation to the n-type semiconductors and the p-type semiconductors, other materials may be mixed to the material for the colored layer 152c in order to improve the charge transport property of the colored layer 152c.

As described above, the colored layer 152c can be formed to have a desired color of R, G, or B. Thus, with the colored layer 152c having a desired color, the photoelectric conversion element 152 can function as a color filter.

Figure 3E:
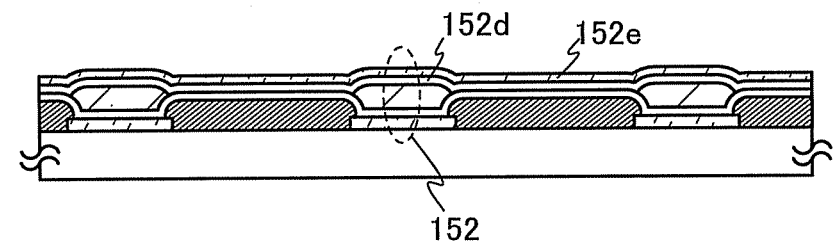

Next, the second buffer layer 152d is formed over the first buffer layer 152b and the colored layer 152c (see FIG. 3E). Materials and methods similar to those of the first buffer layer 152b can be used to form the second buffer layer 152d. The first buffer layer 152b which is previously formed and the second buffer layer 152d can be used for the colored layer 152c having any color of R, G, and B in common. Such a structure is preferable, in which case the manufacturing steps can be shortened.

Next, the fourth electrode 152e is formed over the second buffer layer 152d (see FIG. 3E). As the fourth electrode 152e, a conductive film transmitting visible light can be used. For example, a material similar to that of the third electrode 152a is preferably used.

Through the above steps, the photoelectric conversion element 152 and the light-blocking film 153 can be formed over the second substrate 151. Note that in this specification, the photoelectric conversion element 152 includes the third electrode 152a, the first buffer layer 152b, the colored layer 152c, the second buffer layer 152d, and the fourth electrode 152e.

As described above, the first substrate 101 and the second substrate 151 are separately formed, whereby the incidence of defects can be low and yield can be improved. In addition, alignment and bonding of the first substrate 101 and the second substrate 151 are performed to form the light-emitting device. There is no particular limitation on the bonding of the first substrate 101 and the second substrate 151. A transparent adhesive having high refractive index and capable of bonding the first substrate 101 and the second substrate 151 can be used.

Note that the photoelectric conversion element 152 provided over the second substrate 151 transmits light in a specific wavelength band emitted from the light-emitting element 120 provided over the first substrate 101. The photoelectric conversion element 152 absorbs light other than light in the specific wavelength band emitted from the light-emitting element 120 and converted the light into electric power.

Red light, green light, or blue light is transmitted through the photoelectric conversion element 152 by adjusting the p-type semiconductor and the n-type semiconductor which are materials of the colored layer 152c in the photoelectric conversion element 152; therefore, the photoelectric conversion element 152 also functions as a color filter.

As described above, the photoelectric conversion element and the light-emitting element are interposed between the pair of substrates, so that the distance between the photoelectric conversion element and the light-emitting element is shortened and almost all light emitted from the light-emitting element enters the photoelectric conversion element. Consequently, light emitted from the light-emitting element is efficiently converted into electric power, and the light energy reuse type light-emitting device with low power consumption can be provided.

In addition, the photoelectric conversion element and the light-emitting element are interposed between the pair of substrates as described above, whereby the light-emitting element and the photoelectric conversion element can be sealed at the same time and reliability can be improved.

Conventionally, when light enters a color filter (a colored layer), light other than light in a specific wavelength band transmitted through a colored layer is absorbed, so that there is a loss of light. However, in the disclosed invention, part of the photoelectric conversion element is the colored layer; therefore, light in a wavelength band in which light is not transmitted through the colored layer is converted into electric power. As describe above, in the disclosed invention, the light energy reuse type light-emitting device collecting inevitable wasted light energy can be provided.

This embodiment can be implemented in appropriate combination with the structures described in the other embodiments.

Embodiment 2

In this embodiment, a method for manufacturing the second substrate 151 over which a photoelectric conversion element and a light-blocking film, which are different from those in Embodiment 1, are formed will be described with reference to FIGS. 4A to 4E.

In this embodiment, an example of a structure in which the photoelectric conversion element and the light-blocking film have functions of photoelectric conversion will be described. With a combination of the photoelectric conversion element and the light-blocking film in such a manner, light emitted from the light-emitting element 120 can be more effectively used.

Figure 4A:
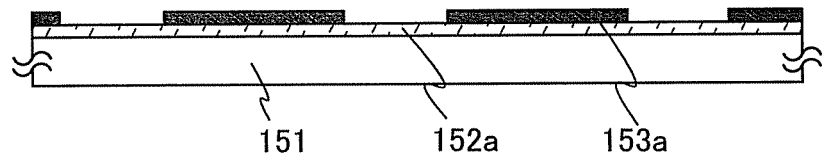
FIGS. 4A to 4E show a method for manufacturing a light-emitting device.

First, the third electrode 152a is formed over the second substrate 151 (see FIG. 4A). As the third electrode 152a, a conductive film transmitting visible light is used. As the conductive film transmitting visible light, for example, indium oxide ($In_2O_3$), tin oxide ($SnO_2$), zinc oxide (ZnO), ITO, indium oxide-zinc oxide alloy ($In_2O_3$—ZnO), or any of these metal oxide materials in which silicon oxide is contained can be used. Further, a metal thin film having a thickness enough to transmit light (preferably, approximately 1 nm to 30 nm) can also be used.

Next, a fifth electrode 153a is formed over the third electrode 152a (see FIG. 4A). As the fifth electrode 153a, a metal film formed by a sputtering method, such as a Ti film, may be used, for example.

Figure 4B:
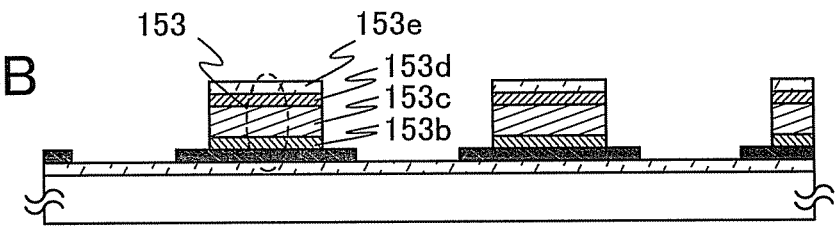

Next, a p-type semiconductor layer 153b, an i-type semiconductor layer 153c, and an n-type semiconductor layer 153d are formed to be stacked in this order over the fifth electrode 153a (see FIG. 4B).

The p-type semiconductor layer 153b, the i-type semiconductor layer 153c, and the n-type semiconductor layer 153d can be formed using an amorphous semiconductor film, a polycrystalline semiconductor film, a microcrystalline semiconductor film, or the like by a sputtering method, an LPCVD method, a plasma CVD method, or the like. In the case of employing these manufacturing methods, it is preferable that the p-type semiconductor layer 153b, the i-type semiconductor layer 153c, and the n-type semiconductor layer 153d be successively formed without being exposed to the air so as to prevent dust or the like from being attached to their interfaces.

As a material of a semiconductor used for the p-type semiconductor layer 153b, the i-type semiconductor layer 153c, and the n-type semiconductor layer 153d, silicon, silicon carbide, germanium, silicon germanium, or the like can be used.

When amorphous silicon is used, the p-type semiconductor layer 153b, the i-type semiconductor layer 153c, and the n-type semiconductor layer 153d can be formed by glow discharge decomposition of a formation gas containing silicon such as silane, disilane, or the like, for example.

When boron is used as an impurity element imparting p-type conductivity, the p-type semiconductor layer 153b can be formed by adding boron, diborane, boron trifluoride, or the like to the formation gas, for example. When phosphorus is used as an impurity element imparting n-type conductivity, the n-type semiconductor layer 153d can be formed by adding phosphine, or the like to the formation gas, for example.

Note that a semiconductor used for the i-type semiconductor layer 153c refers to a semiconductor which contains an impurity element imparting p-type or n-type conductivity at a concentration of $1 \times 10^{20}$ cm$^{-3}$ or lower and has photoconductivity 100 or more times as high as dark conductivity. The i-type semiconductor layer 153c also includes a semiconductor containing an impurity element which belongs to Group 13 or Group 15 of the periodic table in its category. That is, the i-type semiconductor layer 153c includes, in its category, a semiconductor which has weak n-type electric conductivity when an impurity element for controlling valence electrons is not added intentionally and to which an impurity element imparting p-type conductivity is added intentionally or unintentionally during or after film formation.

When amorphous silicon containing silicon carbide is used, the p-type semiconductor layer 153b, the i-type semiconductor layer 153c, and the n-type semiconductor layer 153d can be formed by glow discharge decomposition of a formation gas containing carbon and silicon. Methane, ethane, or the like are given as a gas containing carbon. Silane, disilane, or the like are given as a gas containing silicon. The gas containing silicon may be diluted with hydrogen or hydrogen and helium.

When a microcrystalline semiconductor containing silicon is used, the p-type semiconductor layer 153b, the i-type semiconductor layer 153c, and the n-type semiconductor layer 153d can be formed with a gas containing silicon diluted with hydrogen by a high-frequency plasma CVD apparatus with a frequency of several tens of megahertz (MHz) to several hundreds of megahertz (MHz) or a microwave plasma CVD apparatus with a frequency of 1 GHz or higher. Silicon hydride such as silane, disilane, or the like, silicon fluoride, or silicon chloride may be used as a gas containing silicon. Further, the gas containing silicon may be diluted with hydrogen and one or more kinds of rare gases selected from helium, argon, krypton, and neon.

When a polycrystalline semiconductor is used, the p-type semiconductor layer 153b, the i-type semiconductor layer 153c, and the n-type semiconductor layer 153d can be formed by crystallization of an amorphous semiconductor or a microcrystalline semiconductor by laser crystallization, thermal crystallization, thermal crystallization in which a catalytic element which promotes crystallization, such as nickel, is used, or the like alone, or by a combination of any of the above methods. Alternatively, a polycrystalline semiconductor may be formed directly by a sputtering method, a plasma CVD method, a thermal CVD method, or the like.

Note that in this embodiment, the case where a pin junction is formed by stacking the p-type semiconductor layer 153b, the i-type semiconductor layer 153c, and the n-type semiconductor layer 153d in this order is shown as an example; however, the present invention is not limited to this structure. The n-type semiconductor layer 153d, the i-type semiconductor layer 153c, and the p-type semiconductor layer 153b may be stacked in this order.

Note that a resist mask is formed by a photolithography step and an unnecessary portion is removed, so that the p-type semiconductor layer 153b, the i-type semiconductor layer 153c, and the n-type semiconductor layer 153d can be formed. As the etching, dry etching, wet etching, or the like can be performed.

In the case of using the dry etching, as an etching gas, a chloride gas such as chlorine, boron chloride, silicon chloride, carbon tetrachloride, or the like; a fluoride gas such as carbon tetrafluoride, sulfur fluoride, nitrogen fluoride, or the like; oxygen; or the like can be used as appropriate. For example, the dry etching may be performed by, for example, a reactive ion etching (RIE) method, an inductively coupled plasma (ICP) etching method, an electron cyclotron resonance (ECR) etching method, a parallel plate type (capacitive coupled type) etching method, a magnetron plasma etching method, a dual-frequency plasma etching method, a helicon wave plasma etching method, or the like.

Further, in the case of using the wet etching, a solution of tetramethylammonium hydroxide (abbreviation: TMAH) can be used as an etchant.

Next, a conductive film is formed over the n-type semiconductor layer 153d, and then, a sixth electrode 153e is formed by a photolithography step and an etching step (see FIG. 4B).

As the sixth electrode 153e, a conductive film transmitting visible light is used. As the conductive film transmitting visible light, for example, indium oxide ($In_2O_3$), tin oxide ($SnO_2$), zinc oxide (ZnO), ITO, indium oxide-zinc oxide alloy ($In_2O_3$—ZnO), or any of these metal oxide materials in which silicon oxide is contained can be used. Further, a metal thin film having a thickness enough to transmit light (preferably, approximately 1 nm to 30 nm) can also be used.

Through the above steps, the light-blocking film 153 is formed. Note that in this embodiment, the light-blocking film 153 includes the fifth electrode 153a, the p-type semiconductor layer 153b, the i-type semiconductor layer 153c, the n-type semiconductor layer 153d, and the sixth electrode 153e.

Figure 4C:
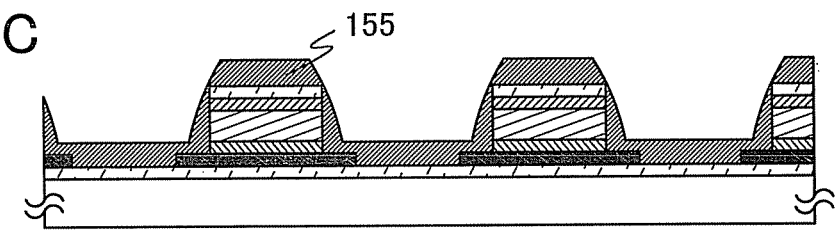

Next, an insulating layer 155 is formed over the third electrode 152a and the light-blocking film 153 (see FIG. 4C). For example, an organic resin including a black pigment can be used to form the insulating layer 155 with a spin coater.

Figure 4D:
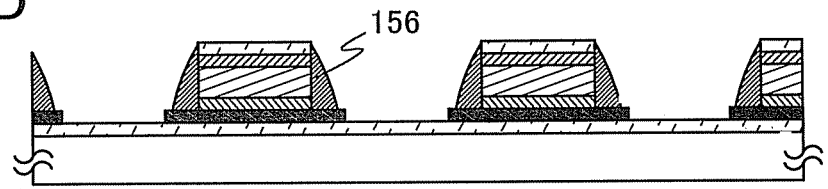

Next, overall etching (so-called etch back) of the insulating layer 155 is performed and parts of the insulating layer 155, which are not in contact with sidewalls of the light-blocking film 153, are removed, so that sidewall layers 156 are formed (see a cross-sectional view of FIG. 4D). With such a structure, oblique light emitted from the light-emitting element can be absorbed by the sidewall layers 156. Further, provision of the sidewall layers 156 can prevent contact between the light-blocking film 153 and the photoelectric conversion element 152 formed later in the horizontal direction.

Figure 4E:
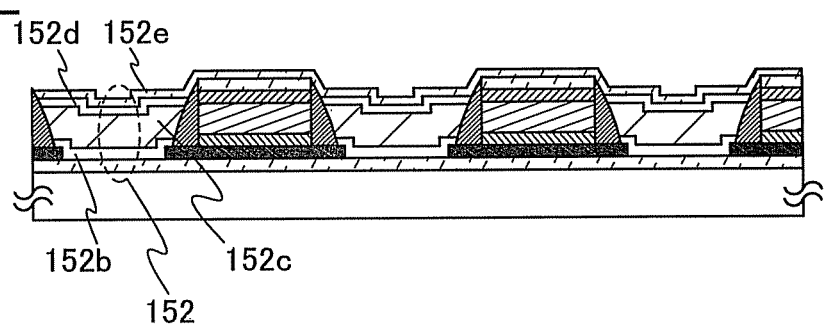

Next, the buffer layer 152b, the colored layer 152c, and the second buffer layer 152d are formed over the third electrode 152a, the light-blocking film 153, and the sidewall layers 156 (see FIG. 4E). The materials and the methods described in the above embodiment can be referred to for the materials and the methods of the buffer layer 152b, the colored layer 152c, and the second buffer layer 152d.

Next, the fourth electrode 152e is formed over the buffer layer 152d, the sidewall layer 156, and the sixth electrode 153e (see FIG. 4E). Note that the photoelectric conversion element 152 includes the third electrode 152a, the buffer layer 152b, the colored layer 152c, the second buffer layer 152d, and the fourth electrode 152e. The fourth electrode 152e and the sixth electrode 153e are directly in contact with each other, whereby the fourth electrode 152e and the sixth electrode 153e are electrically connected to each other. With such a structure, the photoelectric conversion element 152 and the light-blocking film 153 can share one electrode.

Through the above steps, the photoelectric conversion element 152 and the light-blocking film 153 can be formed over the second substrate 151. Further, in this embodiment, since the light-blocking film 153 has a function of light conversion, light emitted from the light-emitting element 120 can be effectively used.

This embodiment can be implemented in appropriate combination with the structures described in the other embodiments.

Embodiment 3

In this embodiment, structures of light-emitting devices which are different from that described in Embodiment 1 will be described with reference to FIGS. 5A and 5B.

In Embodiment 1, a top emission structure in which light is extracted through a substrate facing a substrate provided with the transistor and the light-emitting element is described as an example. In contrast, in this embodiment, a bottom emission structure and a dual emission structure are described as examples. The present invention can be applied to a light-emitting device having any emission structure.

A light-emitting device with a bottom emission structure will be described with reference to FIG. 5A.

Figure 5A:
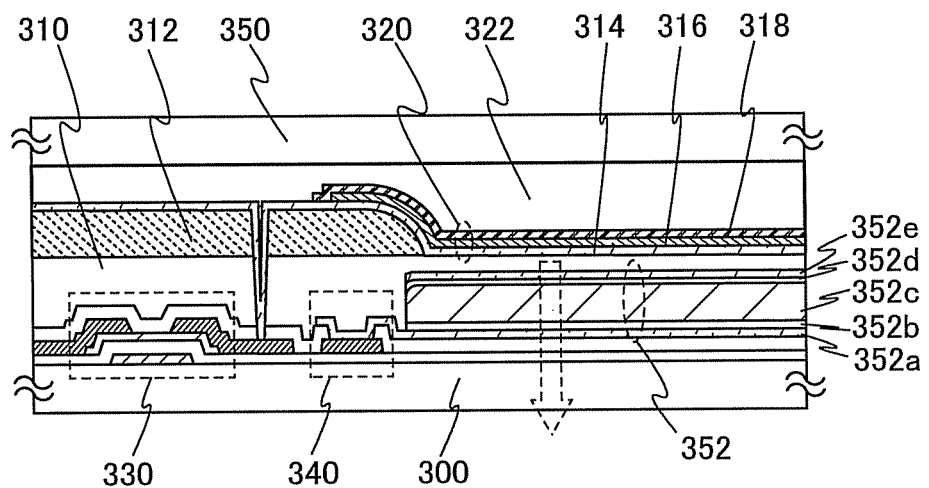
FIGS. 5A and 5B each show a light-emitting device.

FIG. 5A shows a first substrate 300 over which a driver transistor 330, a connection terminal 340, a photoelectric conversion element 352, and a light-emitting element 320 are formed, and a second substrate 350.

Note that a space 322 is provided between the first substrate 300 and the second substrate 350 and the light-emitting element 320 and the photoelectric conversion element 352 are interposed between the first substrate 300 and the second substrate 350.

The light-emitting element 320 and the photoelectric conversion element 352 are interposed between the first substrate 300 and the second substrate 350 as described above, whereby the light-emitting element 320 and the photoelectric conversion element 352 can be sealed at the same time.

Materials similar to those of the first substrate 101 described in Embodiment 1 can be use to form the first substrate 300.

The driver transistor 330 can be formed in a manner similar to that of the transistor 130 described in Embodiment 1.

The photoelectric conversion element 352 includes a third electrode 352a electrically connected to the connection terminal 340, a first buffer layer 352b, a colored layer 352c, a second buffer layer 352d, and a fourth electrode 352e. Materials and methods similar to those of the photoelectric conversion element 152 described in Embodiment 1 can be used to form the photoelectric conversion element 352. Note that similar to the photoelectric conversion element 152 described in Embodiment 1, the photoelectric conversion element 352 also functions as a color filter.

As the connection terminal 340, the third electrode 352a included in the photoelectric conversion element 352 is electrically connected to a wiring. Note that the fourth electrode 352e included in the photoelectric conversion element 352 is electrically connected to another connection terminal (not shown). With the connection terminal 340, it is possible to extract electric power converted by the photoelectric conversion element 352 to the outside.

The light-emitting element 320 is formed over an insulating layer 310 and a partition wall 312 which are farmed over the driver transistor 330. In the light-emitting element 320, an EL layer 316 and a second electrode 318 are stacked in this order over a first electrode 314 electrically connected to the driver transistor 330.

For the insulating layer 310, it is preferable to use a material capable of separating the photoelectric conversion element 352 and the light-emitting element 320 and planarizing unevenness of the transistor 330. In addition, a material capable of transmitting light from the light-emitting element 320 is preferably used. In this embodiment, an acrylic resin having a high light-transmitting property is used as an organic resin film. An organic resin film of polyimide, acrylic, polyamide, epoxy, or the like; an inorganic insulating film; or organic polysiloxane can be used to form the partition wall 312.

As the first electrode 314, a conductive film transmitting visible light is used. As the conductive film transmitting visible light, for example, indium oxide ($In_2O_3$), tin oxide ($SnO_2$), zinc oxide (ZnO), ITO, indium oxide-zinc oxide alloy ($In_2O_3$—ZnO), or any of these metal oxide materials in which silicon oxide is contained can be used. Further, a metal thin film having a thickness enough to transmit light (preferably, approximately 1 nm to 30 nm) can also be used.

Materials and methods similar to those of the EL layer 118 described in Embodiment 1 can be used to form the EL layer 316.

For the second electrode 318, a material reflecting light emitted from the EL layer 316 efficiently is preferably used. This is because the light-extraction efficiency can be improved. Note that the second electrode 318 may have a stacked-layer structure. For example, as the second electrode 318, a stacked-layer structure can be used in which a conductive film of metal oxide, a titanium film, or the like is formed thin on the side which is in contact with the EL layer 316 including a light-emitting substance, and a metal film (aluminum, an alloy containing aluminum, silver, or the like) having high reflectance is formed thereover. Such a structure is preferable because the formation of an insulating film between the EL layer 316 and a metal film (aluminum, an alloy of aluminum, silver, or the like) having high reflectance can be suppressed.

A material capable of sealing the light-emitting element 320 and the photoelectric conversion element 352 is used for the second substrate 350. Since the light-emitting device shown in FIG. 5A has a bottom emission structure, a substrate which does not have a light-transmitting property may be used. As the second substrate 350, a glass substrate, a metal substrate, or the like can be used as appropriate, for example.

Materials and methods similar to those of the space 160 described in Embodiment 1 can be used for the space 322. Further, the space 322 may be filled with a dry agent which can remove moisture or the like entering the light-emitting element 320 and the photoelectric conversion element 352.

In the light-emitting device shown in FIG. 5A, the light-emitting element 320 includes the first electrode 314, the EL layer 316, and the second electrode 318. In the case of the element structure shown in FIG. 5A, light is emitted from the light-emitting element 320 to the first substrate 300 side and then emitted to the outside through the photoelectric conversion element 352 as shown by an arrow.

Next, a light-emitting device having a dual emission structure will be described with reference to FIG. 5B.

Figure 5B:
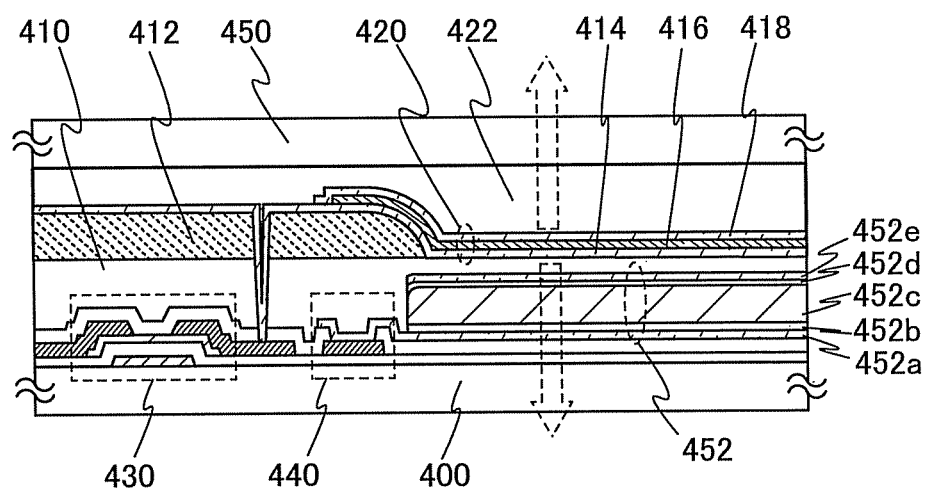

FIG. 5B shows a first substrate 400 over which a driver transistor 430, a connection terminal 440, a photoelectric conversion element 452, and a light-emitting element 420 are formed and a second substrate 450.

Note that a space 422 is provided between the first substrate 400 and the second substrate 450 and the light-emitting element 420 and the photoelectric conversion element 452 are interposed between the first substrate 400 and the second substrate 450.

The light-emitting element 420 and the photoelectric conversion element 452 are interposed between the first substrate 400 and the second substrate 450 as described above, whereby the light-emitting element 420 and the photoelectric conversion element 452 can be sealed at the same time.

The driver transistor 430 can be formed in a manner similar to that of the transistor 130 described in Embodiment 1.

The photoelectric conversion element 452 includes a third electrode 452a electrically connected to the connection terminal 440, a first buffer layer 452b, a colored layer 452c, a second buffer layer 452d, and a fourth electrode 452e. Materials and methods similar to those of the photoelectric conversion element 152 described in Embodiment 1 can be used to form the photoelectric conversion element 452. Note that similar to the photoelectric conversion element 152 described in Embodiment 1, the photoelectric conversion element 452 also functions as a color filter.

As the connection terminal 440, the third electrode 452a included in the photoelectric conversion element 452 is electrically connected to a wiring. Note that the fourth electrode 452e included in the photoelectric conversion element 452 is electrically connected to another connection terminal (not shown). With the connection terminal 440, it is possible to extract electric power converted by the photoelectric conversion element 452 to the outside.

The light-emitting element 420 is formed over an insulating layer 410 and a partition wall 412 which are formed over the driver transistor 430. In the light-emitting element 420, an EL layer 416 and a second electrode 418 are stacked in this order over a first electrode 414 electrically connected to the driver transistor 430.

For the insulating layer 410, it is preferable to use a material capable of separating the photoelectric conversion element 452 and the light-emitting element 420 and planarizing unevenness of the transistor 430. In addition, a material capable of transmitting light from the light-emitting element 420 is preferably used. In this embodiment, an acrylic resin having a high light-transmitting property is used as an organic resin film. An organic resin film of polyimide, acrylic, polyamide, epoxy, or the like; an inorganic insulating film; or organic polysiloxane can be used to form the partition wall 412.

As the first electrode 414, a conductive film transmitting visible light is used. As the conductive film transmitting visible light, for example, indium oxide ($In_2O_3$), tin oxide ($SnO_2$), zinc oxide (ZnO), ITO, indium oxide-zinc oxide alloy ($In_2O_3$—ZnO), or any of these metal oxide materials in which silicon oxide is contained can be used. Further, a metal thin film having a thickness enough to transmit light (preferably, approximately 1 nm to 30 nm) can also be used.

Materials and methods similar to those of the EL layer 118 described in Embodiment 1 can be used to form the EL layer 416.

As the second electrode 418, a conductive film transmitting visible light is used. Note that one of the first electrode 414 and the second electrode 418 functions as an anode and the other thereof functions as a cathode. Therefore, materials with different work functions are preferably used for the first electrode 414 and the second electrode 418. It is preferable to use a substance having a high work function for the electrode which functions as an anode, and a substance having a low work function for the electrode which functions as a cathode.

A material capable of sealing the light-emitting element 420 and the photoelectric conversion element 452 is used for the first substrate 400 and the second substrate 450. Note that since the light-emitting device shown in FIG. 5B has a dual emission structure, a light-transmitting material is used for the first substrate 400 and the second substrate 450. As the first substrate 400 and the second substrate 450, a glass substrate or the like can be used as appropriate, for example.

Materials and methods similar to those of the space 160 described in Embodiment 1 can be used for the space 422. Further, the space 422 may be filled with a dry agent which can remove moisture or the like entering the light-emitting element 420 and the photoelectric conversion element 452. Note that in the case where a dry agent or the like is put in the space 422, light from the light-emitting element 420 might be blocked; therefore, the dry agent is not necessarily provided.

In this embodiment, the light-emitting element 420 includes the first electrode 414, the EL layer 416, and the second electrode 418. In the case of the element structure shown in FIG. 5B, light is emitted from the light-emitting element 420 to both the first substrate 400 side and the second substrate 450 side as shown by arrows.

Note that when light is emitted from the light-emitting element 420 to the first substrate 400 side, the light passes through the photoelectric conversion element 452, so that light is absorbed by the photoelectric conversion element 452; in contrast, light emitted to the second substrate 450 side does not pass through the photoelectric conversion element 452. Consequently, when such a light-emitting element having a dual emission structure is used, a substrate having a structure similar to that of the second substrate 151 described in Embodiment 1 is preferably used as the second substrate 450 in order to perform color display on surfaces of the first substrate 400 and the second substrate 450.

As described above, the photoelectric conversion element and the light-emitting element are interposed between the pair of substrates, so that the distance between the photoelectric conversion element and the light-emitting element is shortened and almost all light emitted from the light-emitting element enters the photoelectric conversion element. Consequently, light emitted from the light-emitting element is efficiently converted into electric power, and the light energy reuse type light-emitting device with low power consumption can be provided.

In addition, the photoelectric conversion element and the light-emitting element are interposed between the pair of substrates as described above, whereby the light-emitting element and the photoelectric conversion element can be sealed at the same time and reliability can be improved.

Conventionally, when light enters a color filter (a colored layer), light other than light in a specific wavelength band transmitted through a colored layer is absorbed, so that there is a loss of light. However, in the disclosed invention, part of the photoelectric conversion element is the colored layer; therefore, light in a wavelength band in which light is not transmitted through the colored layer is converted into electric power. As describe above, in the disclosed invention, the light energy reuse type light-emitting device collecting inevitable wasted light energy can be provided.

This embodiment can be combined with any of the other embodiments as appropriate.

Embodiment 4

In this embodiment, a light-emitting device that is one embodiment of the present invention will be described with reference to FIG. 6.

Figure 6:
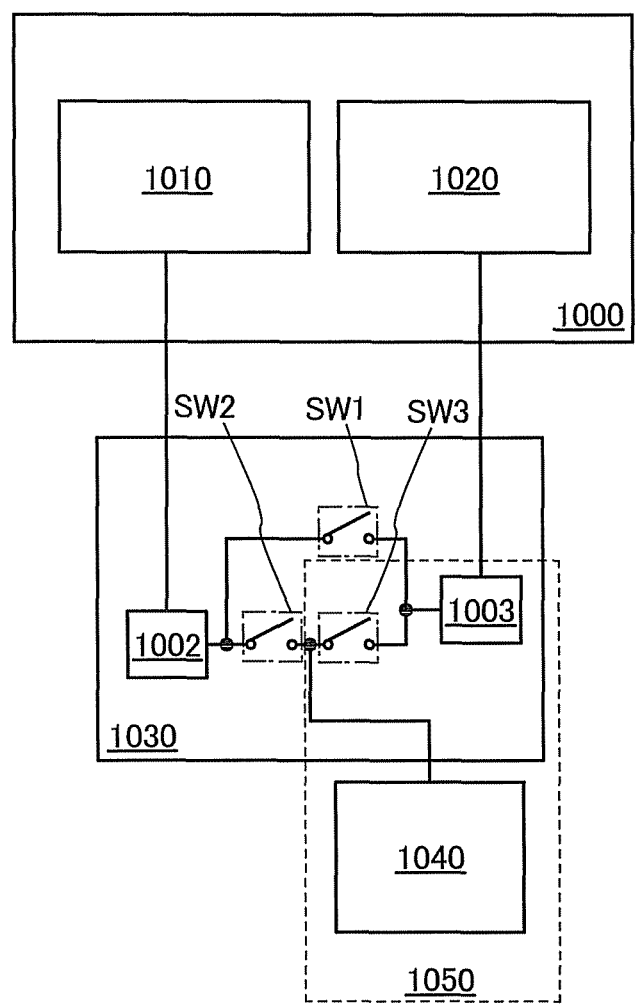
FIG. 6, is a block diagram showing a light-emitting device.

FIG. 6 shows a block diagram of a light-emitting device 1000, a peripheral circuit, and the like, in which a photoelectric conversion element 1010, a light-emitting element 1020, a power control circuit 1030, a storage battery 1040, and a light-emission control circuit 1050 are included. Note that the power control circuit 1030 including a converter 1002, a converter 1003, and switches SW1 to SW3 is shown as an example. Further, the light-emission control circuit 1050 including the converter 1003, the switch SW3, and the storage battery 1040 is shown as an example. Note that the light-emitting element 1020 includes a light-emitting element and a transistor for driving the light-emitting element.

First, the operation in the case where light emitted from the light-emitting element 1020 and light from the outside are absorbed by the photoelectric conversion element 1010 and converted into electric power, so that electric power is generated will be described.

Electric power generated in the photoelectric conversion element 1010 having a function of photoelectric conversion is stepped up or down by the converter 1002 so as to be a voltage for charging the storage battery 1040. Then, when electric power from the photoelectric conversion element 1010 is used for the operation of the light-emitting element 1020, the switch SW1 is turned on and the voltage of the electric power is stepped up or down by the converter 1003 so as to be a voltage needed to operate the light-emitting element 1020. In addition, when display on the light-emitting element 1020 is not performed, the switch SW1 is turned off and the switch SW2 is turned on so that charge of the storage battery 1040 may be performed.

Further, in the case where electric power needed for the light-emitting element 1020 cannot be obtained from the photoelectric conversion element 1010 alone, the switch SW1 and the switch SW3 may be turned on so that electric power from the photoelectric conversion element 1010 and electric power from the storage battery 1040 can be used together.

Next, operation in the case where the photoelectric conversion element 1010 does not generate electric power, that is, the case where the light-emitting element 1020 does not emit light and the photoelectric conversion element 1010 does not absorb light from the outside will be described.

Because electric power from the photoelectric conversion element 1010 is not provided, the light-emission control circuit 1050 operates so that electric power which is already stored in the storage battery 1040 is used. That is, by turning on the switch SW3, electric power stored in the storage battery 1040 is stepped up or down by the converter 1003. Then, the electric power from the storage battery 1040 is used for operating the light-emitting element 1020.

Note that there is no particular limitation on the storage battery 1040; however, it is preferable to use a lithium ion battery because there is an advantage of downsizing or the like.

This embodiment can be implemented in appropriate combination with the structures described in the other embodiments.

Embodiment 5

In this embodiment, details of the light-emitting element 120 including the first electrode 114, the EL layer 118, and the second electrode 119 which are described in Embodiment 1 will be described with reference to FIGS. 7A and 7B.

<Structure of Light-Emitting Element>

Figure 7A:
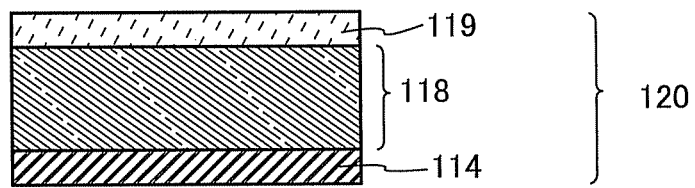
FIGS. 7A and 7B each show an example of a light-emitting element.

The light-emitting element 120 shown in FIG. 7A has a structure in which the EL layer 118 including a light-emitting region is interposed between a pair of electrodes (the first electrode 114 and the second electrode 119). Note that the first electrode 114 is used as an anode and the second electrode 119 is used as a cathode as an example in the following description of this embodiment.

The EL layer 118 includes at least a light-emitting layer, and may have a stacked-layer structure including a functional layer other than the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

The light-emitting element 120 shown in FIG. 7A emits light when current flows because of a potential difference generated between the first electrode 114 and the second electrode 119, and holes and electrons are recombined in the EL layer 118. That is, the light-emitting element 120 has a structure in which the light-emitting region is formed in the EL layer 118.

In one embodiment of the present invention, light from the light-emitting element is extracted from the first electrode 114 side or the second electrode 119 side to the outside. Therefore, one of the first electrode 114 and the second electrode 119 is formed of a light-transmitting substance.

Figure 7B:
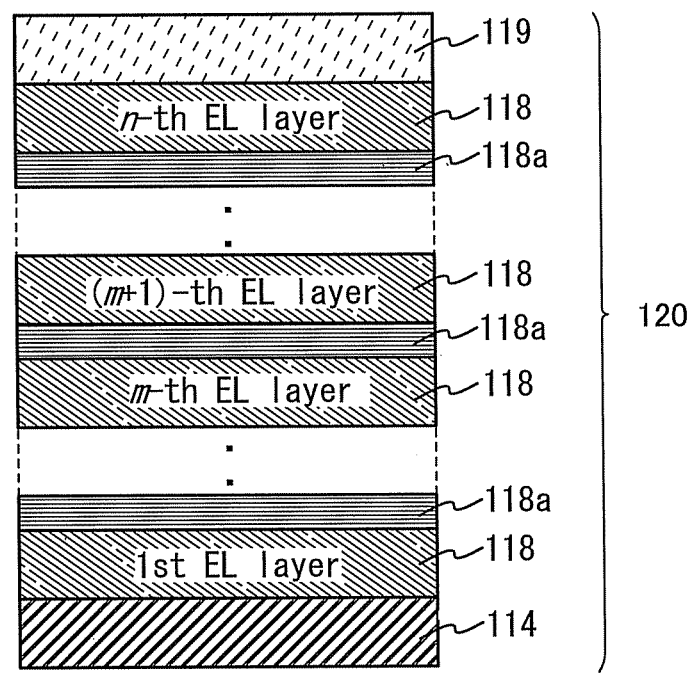

Note that a plurality of EL layers 118 may be stacked between the first electrode 114 and the second electrode 119 as shown in FIG. 7B. In the case where n (n is a natural number of 2 or more) layers are stacked, a charge generation layer 118a is preferably provided between each m-th (m is a natural number greater than or equal to 1 and less than or equal to n−1) EL layer and each (m+1)-th EL layer.

The charge generation layer 118a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use an organic compound which has a hole-transport property and has a hole mobility of $10^{-6}$ $cm^2/Vs$ or higher. However, substances other than the above-described materials may also be used as long as the substances have a higher hole-transport property than an electron-transport property. These materials used for the charge generation layer 118a are excellent in a carrier-injection property and a carrier-transport property; thus, the light-emitting element 120 can be driven with low current and with low voltage.

Note that the charge generation layer 118a may be formed by combining the composite material of an organic compound and a metal oxide with another material. For example, a layer containing the composite material of an organic compound and a metal oxide may be combined with a layer containing a compound of a substance selected from substances with an electron-donating property and a compound with a high electron-transport property. Moreover, a layer containing the composite material of an organic compound and a metal oxide may be combined with a transparent conductive film.

As for the light-emitting element 120 having such a structure, problems such as energy transfer, quenching, and the like are unlikely to occur, and a light-emitting element having both high light emission efficiency and long lifetime is easily obtained due to expansion in the choice of materials. Further, a light-emitting element which provides phosphorescence from one of light-emitting layers and fluorescence from the other of the light-emitting layers can be easily obtained.

Note that the charge generation layer 118a has a function of injecting holes to one of the EL layers 118, which is formed in contact with the charge generation layer 118a, and a function of injecting electrons to the other of the EL layers 118, when a voltage is applied between the first electrode 114 and the second electrode 119.

The light-emitting element 120 shown in FIG. 7B can provide a variety of emission colors by changing the type of the light-emitting substance which is used for the EL layer. In addition, a plurality of light-emitting substances of different emission colors is used as the light-emitting substance, whereby light emission having a broad spectrum or white light emission can also be obtained.

In the case of obtaining white light emission using the light-emitting element 120 shown in FIG. 7B, as for the combination of a plurality of EL layers, a structure for emitting white light including red light, blue light, and green light may be used. One example is a structure including a first EL layer containing a blue fluorescent material as a light-emitting substance and a second EL layer containing red and green phosphorescent materials as light-emitting substances. Alternatively, the structure may include a first EL layer exhibiting red light emission, a second EL layer exhibiting green light emission, and a third EL layer exhibiting blue light emission. Also with a structure including EL layers emitting light of complementary colors, white light emission can be obtained. When light emission from the first EL layer and light emission from the second EL layer have complementary colors to each other in an element including two EL layers stacked, the combination of colors are as follows: blue and yellow, blue-green and red, and the like.

Note that in the structure of the above-mentioned stacked element, by providing the charge generation layer between the stacked EL layers, the element can have long lifetime in a high-luminance region while keeping the current density low. In addition, the voltage drop due to resistance of an electrode material can be reduced, whereby uniform light emission in a large area is possible.

This embodiment can be implemented in appropriate combination with the structures described in the other embodiments.

Embodiment 6

Figure 8A:
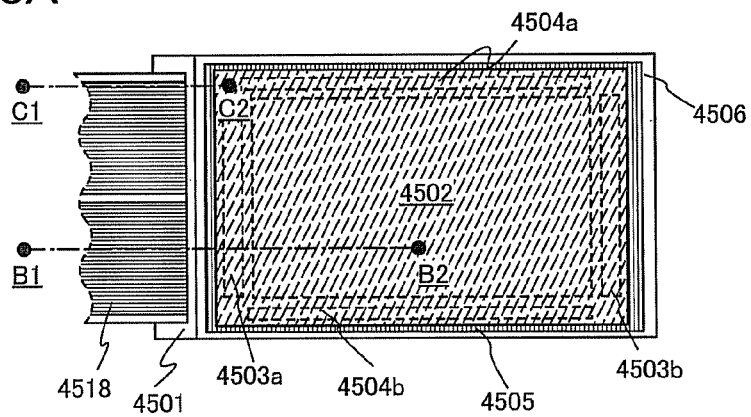
FIGS. 8A to 8C show a light emitting device.
Figure 8B:
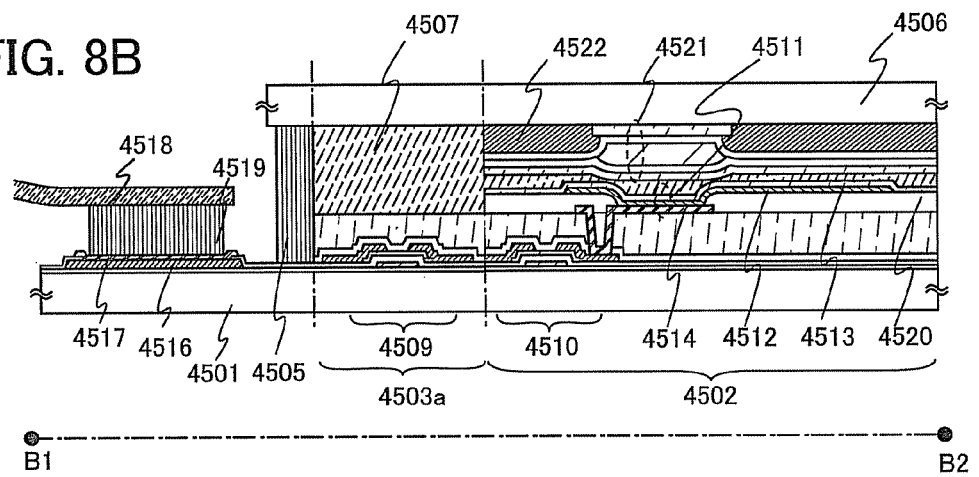
Figure 8C:
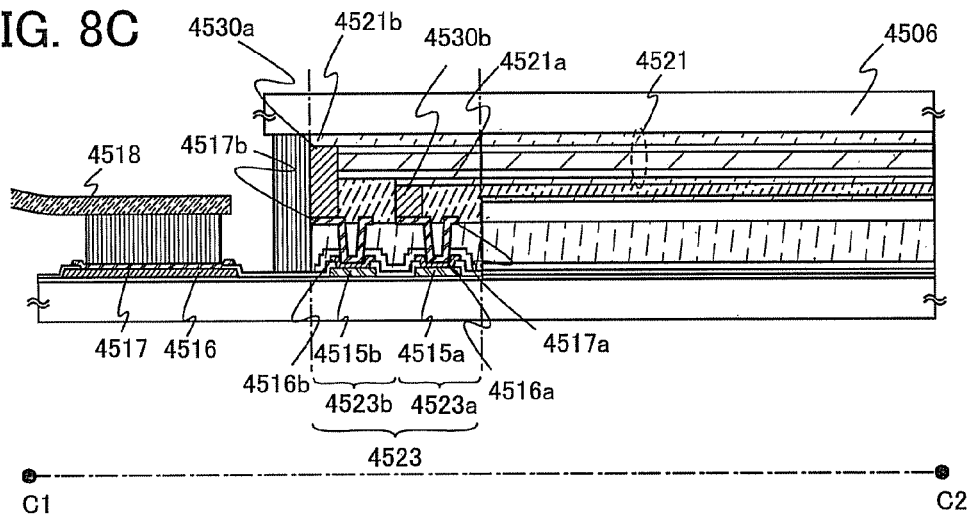

In this embodiment, a light-emitting device that is one embodiment of the present invention will be described with reference to FIGS. 8A to 8C. FIG. 8A is a plan view of a panel in which a driver transistor for a light-emitting element and a light-emitting element provided over a first substrate, and a light-blocking film and a photoelectric conversion element provided on a second substrate, are sealed with a sealant. FIG. 8B corresponds to a cross-sectional view taken along a line B1-B2 in FIG. 8A. FIG. 8C corresponds to a cross-sectional view taken along a line C1-C2 in FIG. 8A.

In FIG. 8A, a sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b.

Note that the second substrate 4506 is provided with a photoelectric conversion element 4521 and a light-blocking film 4522. The photoelectric conversion element 4521 and the light-blocking film 4522 can be formed by a method similar to that for the photoelectric conversion element 152 and the light-blocking film 153 described in Embodiment 1.

With such a structure, the pixel portion 4502, the signal line driver circuits 4503a and 4503b, and the scan line driver circuits 4504a and 4504b are hermetically sealed together with a filler 4507 by the first substrate 4501, the sealant 4505, and the second substrate 4506. It is preferable that a panel be packaged (sealed) with a protective film (an attachment film, an ultraviolet curable resin film, or the like) or a cover material with little degasification so that the panel is not exposed to the outside air, in which case the air-tightness becomes high.

Further, the pixel portion 4502, the signal line driver circuits 4503a and 4503b, and the scan line driver circuits 4504a and 4504b which are provided over the first substrate 4501 each include a plurality of thin film transistors, and a thin film transistor 4510 included in the pixel portion 4502 and a thin film transistor 4509 included in the signal line driver circuit 4503a are shown in FIG. 8B.

The transistor 4509 and the transistor 4510 can be formed by a method similar to that for the transistor 130 described in Embodiment 1.

Further, a first electrode 4514 included in a light-emitting element 4511 is electrically connected to a source electrode or a drain electrode of the transistor 4510. Note that the light-emitting element 4511 has a stacked-layer structure of the first electrode 4514, an EL layer 4512, and a second electrode 4513. The element structures described in Embodiment 5 can be applied to the structure of the light-emitting element 4511.

A partition wall 4520 is formed using an organic resin film, an inorganic insulating film, or organic polysiloxane. It is particularly preferable that the partition wall 4520 be formed using a photosensitive material to have an opening over the first electrode 4514 so that a sidewall of the opening is formed as a tilted surface with continuous curvature.

The EL layer 4512 may be formed to have a single layer or a stacked-layer structure.

A protective film may be formed over the second electrode 4513 and the partition wall 4520 in order to prevent entry of oxygen, hydrogen, moisture, carbon dioxide, or the like into the light-emitting element 4511. As the protective film, a silicon nitride film, a silicon nitride oxide film, or the like can be used.

In addition, a variety of signals and potentials are supplied from an FPC 4518 to the signal line driver circuit 4503a, the signal line driver circuit 4503b, the scan line driver circuit 4504a, the scan line driver circuit 4504b, or the pixel portion 4502.

A connection terminal electrode 4517 is formed using the same conductive film as the first electrode 4514 of the light-emitting element 4511. A terminal electrode 4516 is formed using the same conductive film as a source electrode and a drain electrode of the transistor 4509 and the source electrode and the drain electrode of the transistor 4510.

The connection terminal electrode 4517 is electrically connected to a terminal included in the FPC 4518 through an anisotropic conductive film 4519.

Light from the light-emitting element 4511 emits through the second substrate 4506 side. Therefore, the second substrate 4506 needs to have a light-transmitting property. For example, a material such as a glass plate, a plastic plate, a polyester film, an acrylic film, or the like is used for the second substrate 4506.

As the filler 4507, an ultraviolet curable resin or a thermosetting resin can be used, as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

If necessary, an optical film such as a polarizing plate, a circularly polarizing plate (including an elliptically polarizing plate), a retardation plate (a quarter-wave plate or a half-wave plate), or the like may be appropriately provided for the second substrate 4506. Further, the polarizing plate or the circularly polarizing plate may be provided with an anti-reflection film. For example, anti-glare treatment can be performed by which reflected light is diffused by unevenness on the surface so as to reduce the glare.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. Alternatively, only the signal line driver circuits or part thereof, or only the scan line driver circuits or part thereof may be separately formed and mounted. One embodiment of the present invention is not limited to the structure shown in FIGS. 8A to 8C.

Next, description will be made on FIG. 8C. In FIG. 8C, the photoelectric conversion element 4521 and a connection terminal portion 4523 are electrically connected to each other through a terminal included in the FPC 4518, a conductive layer 4530a, and a conductive layer 4530b.

The conductive layer 4530a and the conductive layer 4530b should have conductivity. The conductive layer 4530a and the conductive layer 4530b are at least connected to the connection terminal portion 4523 with a conductive adhesive such as a silver paste, a copper paste, a carbon paste, or the like or a resin containing a conductive bead, or by solder joint, or the like.

Further, a third electrode 4521a included in the photoelectric conversion element 4521 is electrically connected to a connection terminal portion 4523a. The third electrode 4521a is electrically connected to an electrode 4517a formed using the same conductive film as the first electrode 4514 of the light-emitting element 4511, an electrode 4516a formed using the same conductive film as the source and drain electrodes of the transistor 4510, and an electrode 4515a formed using the same conductive film as a gate electrode of the transistor 4510.

Note that a fourth electrode 4521*b* included in the photoelectric conversion element 4521 is electrically connected to a connection terminal portion 4523*b*. The fourth electrode 4521*b* is electrically connected to an electrode 4517*b* formed using the same conductive film as the first electrode 4514 of the light-emitting element 4511, an electrode 4516*b* formed using the same conductive film as the source and drain electrodes of the transistor 4510, and an electrode 4515*b* formed using the same conductive film as the gate electrode of the transistor 4510.

Note that in this embodiment, a structure in which electric power from the photoelectric conversion element 4521 is extracted from the FPC 4518 is described as an example; however, the present invention is not limited thereto. As long as the third electrode 4521*a* and the fourth electrode 4521*b* are each connected to an electrode so that electric power is extracted, a power storage portion may be additionally provided outside the light-emitting device (or the pair of substrates). Therefore, one embodiment of the present invention is not limited to the structure of FIGS. 8A to 8C.

As described above, the photoelectric conversion element and the light-emitting element are interposed between the pair of substrates, so that the distance between the photoelectric conversion element and the light-emitting element is shortened and almost all light emitted from the light-emitting element enters the photoelectric conversion element. Consequently, light emitted from the light-emitting element is efficiently converted into electric power, and the light energy reuse type light-emitting device with low power consumption can be provided.

In addition, the photoelectric conversion element and the light-emitting element are interposed between the pair of substrates as described above, whereby the light-emitting element and the photoelectric conversion element can be sealed at the same time and reliability can be improved.

Conventionally, when light enters a color filter (a colored layer), light other than light in a specific wavelength band transmitted through a colored layer is absorbed, so that there is a loss of light. However, in the disclosed invention, part of the photoelectric conversion element is the colored layer; therefore, light in a wavelength band in which light is not transmitted through the colored layer is converted into electric power. As describe above, in the disclosed invention, the light energy reuse type light-emitting device collecting inevitable wasted light energy can be provided.

This embodiment can be implemented in appropriate combination with the structures described in the other embodiments.

Embodiment 7

Figure 9A:
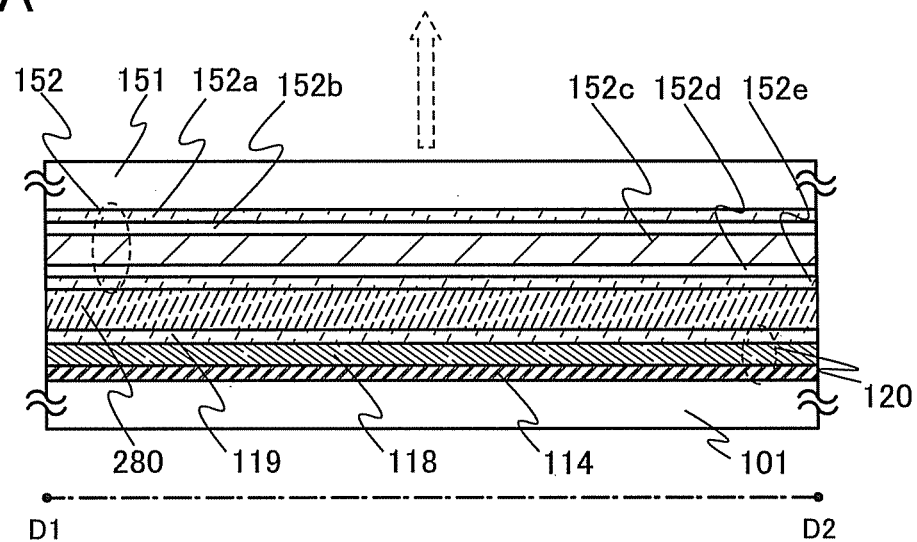
FIGS. 9A and 9B show a lighting device.
Figure 9B:
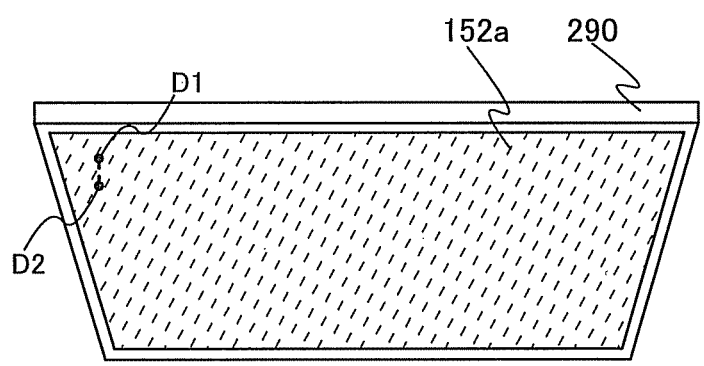

In this embodiment, a structure of a lighting device using a light-emitting device that is one embodiment of the present invention will be described with reference to FIGS. 9A and 9B. FIG. 9A is a cross-sectional view of the light-emitting device in which a light-emitting element including an EL layer provided with a first substrate, and a photoelectric conversion element provided with a second substrate are sealed with a filler. FIG. 9B is a perspective view of the light-emitting device. Note that FIG. 9A corresponds to a cross-sectional view taken along a line D1-D2 in FIG. 9B.

In this embodiment, a transistor is not formed over the first substrate. That is, a light-emitting element including a first electrode, an EL layer, and a second electrode is formed over the first substrate.

The details of the light-emitting device shown in FIG. 9A will be described below.

The light-emitting device shown in FIGS. 9A and 9B is supplied with electric power from an external power source (not shown), whereby the light-emitting element emits light; thus, the light-emitting device shown in FIGS. 9A and 9B can be used as a lighting device.

As shown in FIG. 9A, the light-emitting element 120 including the first electrode 114, the EL layer 118, and the second electrode 119 is formed over the first substrate 101, and the photoelectric conversion element 152 including the third electrode 152*a*, the first buffer layer 152*b*, the colored layer 152*c*, the second buffer layer 152*d*, and the fourth electrode 152*e* is formed on the second substrate 151. Further, the first substrate 101 and the second substrate 151 are hermetically sealed with a filler 280.

The light-emitting device shown in FIG. 9A emits light in a direction shown by an arrow in FIG. 9A and the photoelectric conversion element 152 absorbs and transmits light of the EL layer 118.

Materials and methods described in the above embodiments can be used to manufacture the photoelectric conversion element 152. The photoelectric conversion element 152 transmits light in a specific wavelength band emitted from the light-emitting element 120 and absorbs light other than light in the specific wavelength band emitted from the light-emitting element 120, whereby light with a desired emission color is emitted to the second substrate 151 side. In addition, light absorbed by the photoelectric conversion element 152 is converted into electric power. That is, the photoelectric conversion element 152 has a function of photoelectric conversion and function of a color filter.

As the filler 280, an ultraviolet curable resin or a thermosetting resin can be used other than an inert gas such as nitrogen, argon, or the like. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

Thus, the light-emitting element 120 and the photoelectric conversion element 152 are provided close to each other, so that materials which reflect or absorb light hardly exist between the light-emitting element 120 and the photoelectric conversion element 152. Consequently, light from the light-emitting element 120 can be efficiently absorbed by the photoelectric conversion element 152.

A housing 290 shown in FIG. 9B can store the light-emitting device shown in FIG. 9A, and can be used as a lighting device.

As described above, the photoelectric conversion element and the light-emitting element are interposed between the pair of substrates, so that the distance between the photoelectric conversion element and the light-emitting element is shortened and almost all light emitted from the light-emitting element enters the photoelectric conversion element. Consequently, light emitted from the light-emitting element is efficiently converted into electric power, and the light energy reuse type lighting device with low power consumption can be provided.

In addition, the photoelectric conversion element and the light-emitting element are interposed between the pair of substrates as described above, whereby the light-emitting element and the photoelectric conversion element can be sealed at the same time and reliability can be improved.

This embodiment can be implemented in appropriate combination with the structures described in the other embodiments.

Embodiment 8

In this embodiment, as display devices, a liquid crystal panel and electronic paper will be described with reference to FIGS. 12A and 12B.

Figure 12A:
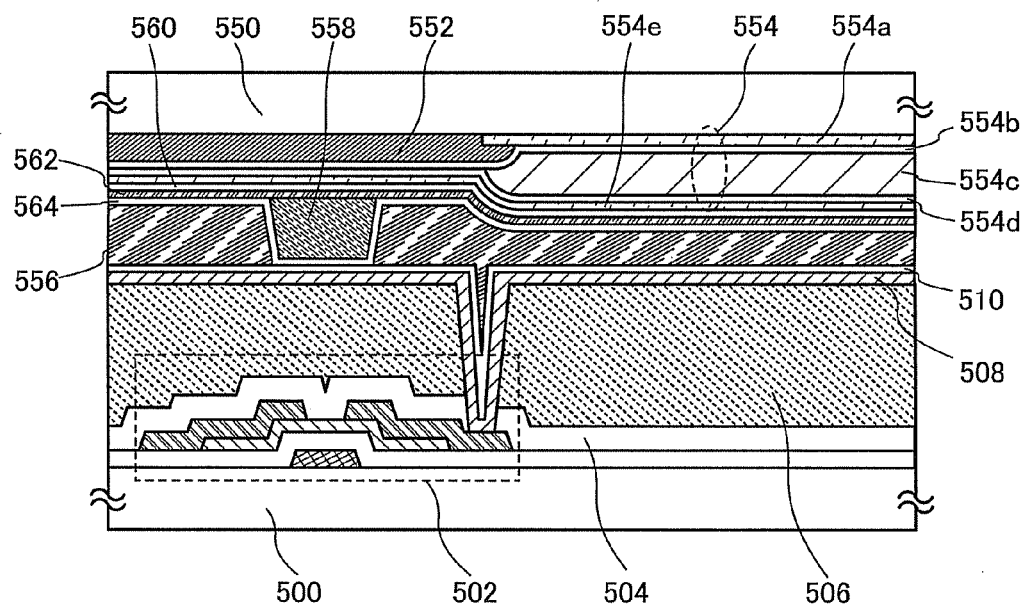
FIGS. 12A and 12B each show a display device.
Figure 12B:
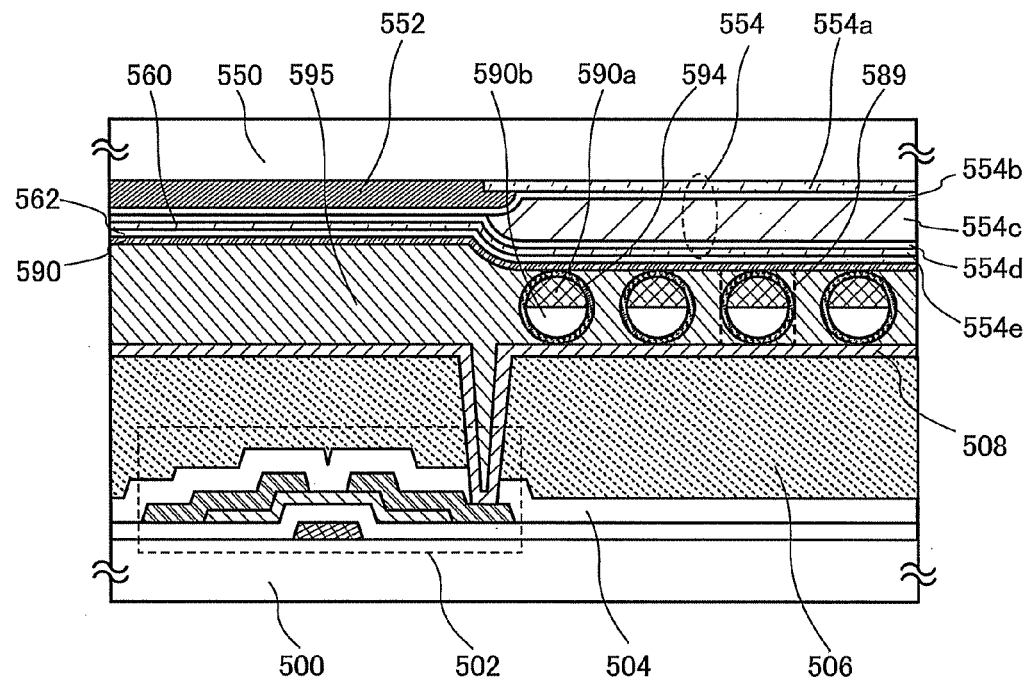

Note that in this specification and the like, the liquid crystal panel shown in FIG. 12A and the electronic paper shown in FIG. 12B are display devices each utilizing a display element (including a liquid crystal element, a twisting ball element, an electrophoretic element, or the like).

First, description is made on the liquid crystal panel shown in FIG. 12A. In FIG. 12A, a first substrate 500 including a transistor 502, a first insulating layer 504 and a second insulating layer 506 which cover the transistor 502, and a first electrode 508 electrically connected to the transistor 502, and a second substrate 550 including a light-blocking film 552, a photoelectric conversion element 554, a third insulating layer 560 provided on the photoelectric conversion element 554, and a counter electrode 562 provided on the third insulating layer 560 are provided. A liquid crystal layer 556 is interposed between the first substrate 500 and the second substrate 550.

Materials and methods similar to those of the transistor 130, the first insulating layer 110, the second insulating layer 112, and the first electrode 114 described in Embodiment 1 can be used for the transistor 502, the first insulating layer 504, the second insulating layer 506, and the first electrode 508, respectively.

The photoelectric conversion element 554 is interposed between the first substrate 500 and the second substrate 550 as described above, whereby the photoelectric conversion element 554 can be sealed.

The photoelectric conversion element 554 includes a third electrode 554a, a first buffer layer 554b, a colored layer 554c, a second buffer layer 554d, and a fourth electrode 554e. Materials and methods similar to those of the photoelectric conversion element 152 described in Embodiment 1 can be used to form the photoelectric conversion element 554.

The third insulating layer 560 may at least electrically insulate the photoelectric conversion element 554 and the counter electrode 562 from each other. For example, a silicon oxide film, a silicon oxynitride film, or the like can be formed by a sputtering method. The third insulating layer 560 can prevent moisture from entering the photoelectric conversion element 554 from the outside. Alternatively, a structure may be employed in which an opening is provided in the third insulating layer 560 so that the fourth electrode 554e of the photoelectric conversion element 554 is extended to the outside.

The first electrode 508 functions as a reflective electrode. Methods and materials similar to those of the first electrode 114 described in Embodiment 1 can be used to form the first electrode 508.

Note that the first electrode 508 reflects and utilizes light from the outside, so that images are displayed. For this reason, although the first electrode 508 itself does not emit light, a reflective film, a reflective plate, and the like which utilize light reflected from the outside are regarded as light sources in this specification and the like.

The first electrode 508 and the counter electrode 562 are provided with an alignment film 510 and an alignment film 564, respectively, and the liquid crystal layer 556 is provided between the first electrode 508 and the counter electrode 562 with the alignment film 510 and the alignment film 564 interposed therebetween. In addition, a spacer 558 is provided on the counter electrode 562, and the first substrate 500 and the second substrate 550 are sealed together with a sealant (not shown).

For the counter electrode 562, a transparent conductive material such as ITO can be used. The electric field of the liquid crystal layer 556 can be controlled by applying a voltage to the first electrode 508 and the counter electrode 562.

The spacer 558 is a columnar spacer obtained by selective etching of an insulating film and is provided in order to control the distance (a cell gap) between the first electrode 508 and the counter electrode 562. Alternatively, a spherical spacer may also be used.

A light-transmitting substrate such as glass, ceramics, or plastics can be used as the first substrate 500 and the second substrate 550. As plastics, a fiberglass-reinforced plastics (FRP) plate, a polyvinyl fluoride (PVF) film, a polyester film, or an acrylic resin film can be used.

A material of the liquid crystal layer 556 is not particularly limited, and twisted nematic (TN) liquid crystal, vertical alignment (VA) liquid crystal, optically compensated birefringence (OCB) liquid crystal, polymer dispersed liquid crystal, discotic liquid crystal, or the like can be used as appropriate.

Alternatively, liquid crystal exhibiting a blue phase for which an alignment film is unnecessary may be used. The blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral agent is mixed may be used in order to improve the temperature range. The liquid crystal composition which includes a liquid crystal exhibiting a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of a liquid crystal display device can be reduced in a manufacturing process. Thus, productivity of the liquid crystal display device can be increased. In particular, when a transistor including an oxide, semiconductor is used, electrical characteristics of the transistor might significantly change and deviate from the designed range by the influence of static electricity. Therefore, it is more effective to use a blue phase liquid crystal material when an oxide semiconductor is used for a transistor.

In this embodiment, a reflective liquid crystal display device is described as an example; however, a transmissive liquid crystal display device and a semi-transmissive liquid crystal display device can also be used. Note that in the transmissive liquid crystal display device and the semi-transmissive liquid crystal display device, a material which can be used for the first electrode 508 can be changed from a reflective material to a light-transmitting material.

An optical member (an optical substrate) such as a polarizing member, a retardation member, or an anti-reflection member, and the like may be provided as appropriate. For example, circular polarization may be obtained by using a polarizing substrate and a retardation substrate. In the case of the transmissive liquid crystal display device and the semi-transmissive liquid crystal display device, a backlight, a side light, or the like may be used as a light source.

Alternatively, a plurality of LED (light-emitting diode) light sources, a plurality of EL light sources, or the like may be used as the backlight in order to improve the moving image characteristics of the transmissive liquid crystal display device and the semi-transmissive liquid crystal display device.

Next, description is made on the electronic paper shown in FIG. 12B. FIG. 12B is a cross-sectional view of active matrix electronic paper.

Note that in FIG. 12B, the same reference numerals denotes the same portions as those in the liquid crystal panel shown in FIG. 12A and detailed description will not be repeated.

In general, since electronic paper has higher reflectivity than a liquid crystal element, an auxiliary light is not needed, power consumption is low, and a display portion can be recognized in a dim place. Further, an image which is displayed once can be retained even when power is not supplied to the display portion.

Note that an arithmetic processing portion (CPU) and the like consume power even when power is not supplied to the display portion; therefore, power consumption can be further reduced with the use of the photoelectric conversion element 554 described in this embodiment.

The electronic paper shown in FIG. 12B is an example of a display device using a twisting ball display system. The twisting ball display system refers to a method in which spherical particles each colored in white and black are arranged between the first electrode 508 and an electrode 590 which are electrode layers, and a potential difference is generated between the first electrode 508 and the electrode 590 to control the orientation of the spherical particles, so that display is performed.

The method in which monochrome display is performed by spherical particles each colored in white and black in such a manner is used for the electronic paper; moreover, in this embodiment, the electronic paper can perform color display with the use of the photoelectric conversion element 554 as a color filter.

In the electronic paper shown in FIG. 12B, spherical particles 589 are provided between the first electrode 508 and the electrode 590. Each spherical particle 589 includes a black region 590a and a white region 590b, and a cavity 594 filled with liquid around the black region 590a and the white region 590b. The spherical particles 589 are surrounded by a filler 595 such as a resin. In this embodiment, the first electrode 508 corresponds to a pixel electrode and the electrode 590 provided over the second substrate 550 corresponds to a common electrode.

The second substrate 550 is arranged to face the first substrate 500. The light-blocking film 552 functioning as a black matrix, the photoelectric conversion element 554, the third insulating layer 560, and the counter electrode 562 are provided for the second substrate 550.

Color display is performed in such a manner that when the white region 590b is positioned at the viewing side, light reflected by the white region 590b is transmitted through the photoelectric conversion element 554 provided as a color filter.

The white region 590b reflects and utilizes light from the outside, so that images are displayed. For this reason, in this specification and the like, although the white region 590b itself or the spherical particle 589 itself including the white region 590b does not emit light, a spherical particle or the like utilizing reflected light from the outside is regarded as a light source.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule provided between the first electrode 508 and the electrode 590, when an electric field is applied by the first electrode 508 and the electrode 590, the white microparticles and the black microparticles move to opposite directions to each other, so that white or black can be displayed. When the white microparticles are positioned at the viewing side, the photoelectric conversion element 554 provided as a color filter transmits light reflected by the white microparticles, so that color display can be performed.

Conventionally, when light enters a color filter (a colored layer), light other than light in a specific wavelength band transmitted through a colored layer is absorbed, so that there is a loss of light as described above. However, in the disclosed invention, part of the photoelectric conversion element is the colored layer; therefore, light in a wavelength band in which light is not transmitted through the colored layer is converted into electric power. As describe above, in the disclosed invention, the light energy reuse type display device collecting inevitable wasted light energy can be provided.

This embodiment can be implemented combining with other embodiments as appropriate.

Embodiment 9

In this embodiment, an electronic appliance including the display device and the light-emitting device described in the above embodiments will be described with reference to FIGS. 10A to 10D.

Examples of the electronic appliance including the light-emitting device and the display device described in the above embodiments include cameras such as video cameras, digital video cameras, or the like, goggle type displays, navigation systems, audio playback devices (e.g., car audio systems and audio systems), computers, game machines, portable information terminals (e.g., mobile computers, mobile phones, portable game machines, and e-book readers), image playback devices in which a recording medium is provided (specifically, devices that are capable of playing back recording media such as digital versatile discs (DVDs) or the like and equipped with a display unit that can display images), and the like. Specific examples of these electronic appliances are shown in FIGS. 10A to 10D.

Figure 10A:
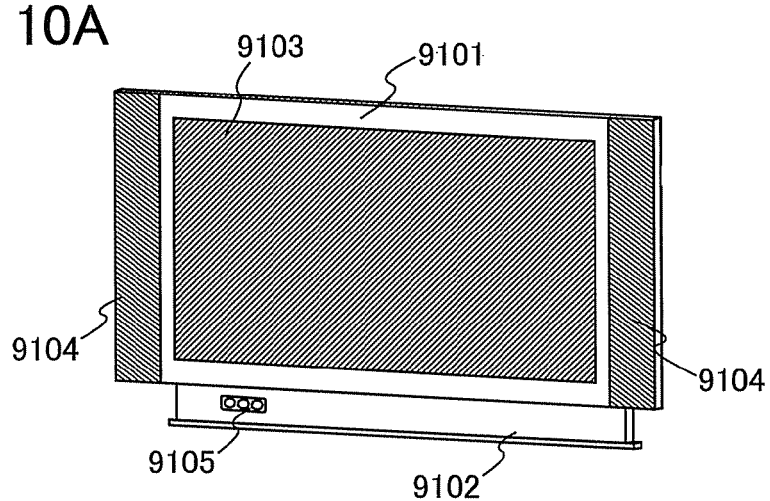
FIGS. 10A to 10D each show an electronic appliance using a display device or a light-emitting device.

FIG. 10A shows a television device including a housing 9101, a support 9102, a display portion 9103, speaker portions 9104, a video input terminal 9105, and the like. In this television device, the display portion 9103 is manufactured using the light-emitting device and the display device described in the above embodiments. A television device including a light energy reuse type light-emitting device and display device can reuse light of the display portion 9103; thus, a television device with low power consumption can be provided.

Figure 10B:
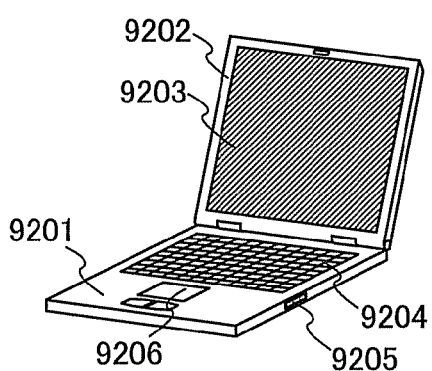

FIG. 10B shows a computer including a main body 9201, a housing 9202, a display portion 9203, a keyboard 9204, an external connection port 9205, a pointing device 9206, and the like. In this computer, the display portion 9203 is manufactured using the light-emitting device and the display device described in the above embodiments. A computer including a light energy reuse type light-emitting device and display device can reuse light of the display portion 9203; thus, a computer with low power consumption can be provided. Further, in the case where the computer is portable, the power consumption thereof is low, so that the computer can be used for a long time.

Figure 10C:
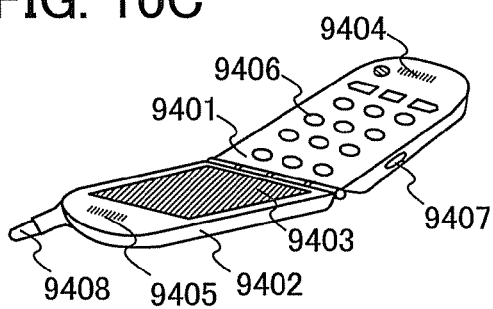

FIG. 10C shows a mobile phone including a main body 9401, a housing 9402, a display portion 9403, an audio input portion 9404, an audio output portion 9405, an operation key 9406, an external connection port 9407, an antenna 9408, and the like. In this mobile phone, the display portion 9403 is manufactured using the light-emitting device and the display device described in the above embodiments. A mobile phone including a light energy reuse type light-emitting device and display device can reuse light of the display portion 9403; thus, a mobile phone with low power consumption can be provided. Further, because the power consumption thereof is low, the mobile phone can be used for a long time.

Figure 10D:
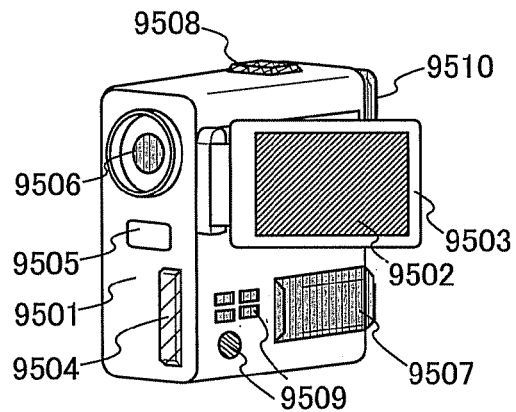

FIG. 10D shows a digital video camera including a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In this digital video camera, the display portion 9502 is manufactured using the light-emitting device and the display device described in the above embodiments. A digital video camera including a light energy reuse type light-emitting device and a light energy reuse type display device can reuse light of the display portion 9502; thus, a digital video camera with low power consumption can be provided.

As described above, the application ranges of the light-emitting device and the display device described in the above embodiments are so wide that this light-emitting device and display device can be applied to electronic appliances in all fields.

This embodiment can be implemented in appropriate combination with the structures described in the other embodiments.

Embodiment 10

In this embodiment, lighting devices each of which is one embodiment of the light-emitting device described in Embodiment 7 will be described with reference to FIGS. 11A and 11B.

Figure 11A:
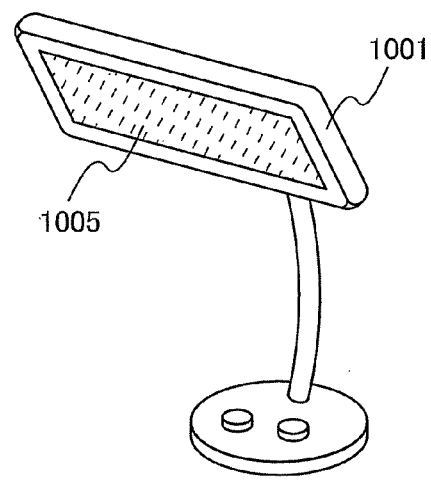
FIGS. 11A and 11B each show a light-emitting device using a lighting device.

FIG. 11A shows an example of a desk lamp using the lighting device of one embodiment of the present invention. The desk lamp includes a housing 1001 and a lighting portion 1005. As the lighting portion 1005, the lighting device of one embodiment of the present invention is used.

Figure 11B:
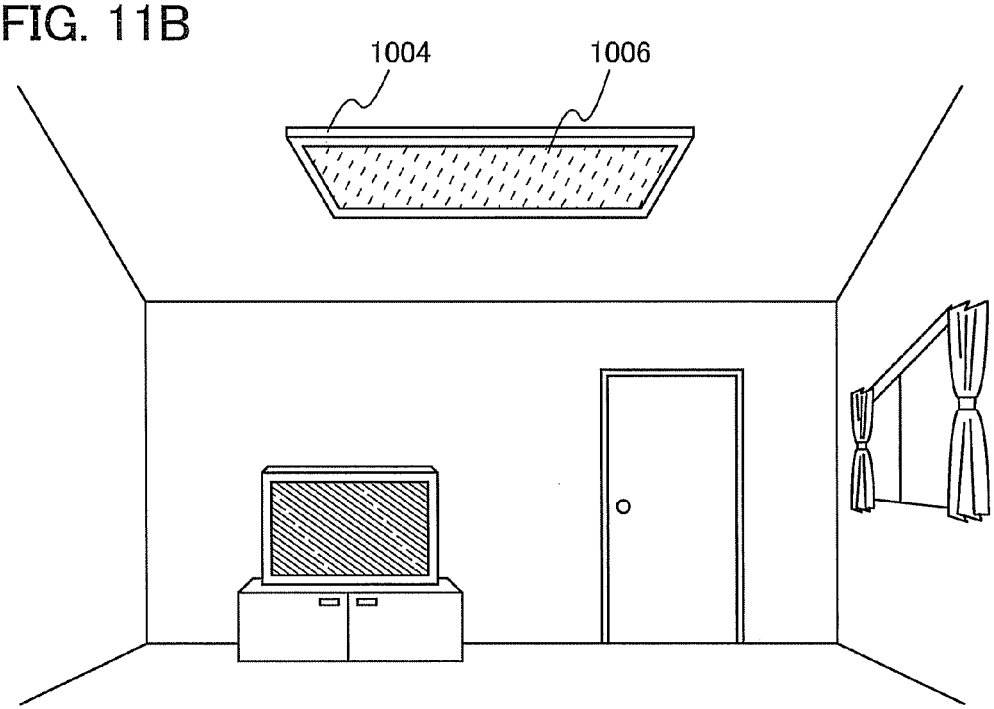

FIG. 11B shows an example of an indoor lighting device using the lighting device of one embodiment of the present invention. The indoor lighting device includes a housing 1004 and a lighting portion 1006. As the lighting portion 1006, the lighting device of one embodiment of the present invention is used.

As described above, with the use of the lighting device that is one embodiment of the present invention, light energy can be reused; thus, a lighting device with low power consumption and reduced environmental load can be provided.

This embodiment can be implemented in appropriate combination with the structures described in the other embodiments.

This application is based on Japanese Patent Application serial No. 2011-010380 filed with Japan Patent Office on Jan. 21, 2011, the entire contents of which are hereby incorporated by reference.

What is claimed is:

1. A light-emitting device comprising:
   a first photoelectric conversion element, a light-emitting element, and a transistor which are provided between a pair of substrates,
   wherein the light-emitting element is electrically connected to the transistor,
   wherein the light-emitting element overlaps with the first photoelectric conversion element,
   wherein the first photoelectric conversion element comprises a colored layer having a transmitting property to light emitted from the light-emitting element in a specific wavelength band, and
   wherein the light is emitted from the light-emitting element through the colored layer.

2. The light-emitting device according to claim 1,
   wherein the first photoelectric conversion element comprises an organic thin film solar cell,
   wherein the first photoelectric conversion element functions as a color filter.

3. The light-emitting device according to claim 1,
   wherein one of the pair of substrates is provided with the light-emitting element, and
   wherein the other one of the pair of substrates is provided with the first photoelectric conversion element.

4. The light-emitting device according to claim 1, wherein the transistor comprises an oxide semiconductor.

5. The light-emitting device according to claim 4, wherein the oxide semiconductor is In—Ga—Zn—O-based metal oxide.

6. An electronic appliance comprising the light-emitting device according to claim 1.

7. The light-emitting device according to claim 1, wherein the light-emitting element emits white light.

8. The light-emitting device according to claim 1, further comprising a second photoelectric conversion element adjacent to the first photoelectric conversion element,
   wherein the second photoelectric conversion element functions as a light-blocking film.

9. A light-emitting device comprising:
   a first photoelectric conversion element and a light-emitting element which are provided between a pair of substrates,
   wherein the light-emitting element overlaps with the first photoelectric conversion element,
   wherein the first photoelectric conversion element comprises a colored layer having a transmitting property to light emitted from the light-emitting element in a specific wavelength band, and
   wherein the light is emitted from the light-emitting element through the colored layer.

10. The light-emitting device according to claim 9,
    wherein the first photoelectric conversion element comprises an organic thin film solar cell,
    wherein the first photoelectric conversion element functions as a color filter.

11. The light-emitting device according to claim 9,
    wherein one of the pair of substrates is provided with the light-emitting element, and
    wherein the other one of the pair of substrates is provided with the first photoelectric conversion element.

12. An electronic appliance comprising the light-emitting device according to claim 9.

13. The light-emitting device according to claim 9, wherein the light-emitting element emits white light.

14. The light-emitting device according to claim 9, further comprising a second photoelectric conversion element adjacent to the first photoelectric conversion element,
    wherein the second photoelectric conversion element functions as a light-blocking film.

15. A display device comprising:
    a light source; and
    a first photoelectric conversion element and a display element which are provided between a pair of substrates,
    wherein the light source overlaps with the first photoelectric conversion element,
    wherein the first photoelectric conversion element comprises a colored layer having a transmitting property to light emitted from the light source in a specific wavelength band, and wherein the light is emitted from the light source through the colored layer.

16. The display device according to claim 15, wherein the first photoelectric conversion element comprises an organic thin film solar cell, wherein the first photoelectric conversion element functions as a color filter.

17. The display device according to claim 15, wherein the display element comprises a liquid crystal element or an electrophoretic element.

18. An electronic appliance comprising the display device according to claim 15.

19. The display device according to claim 15, wherein the light source emits white light.

20. The display device according to claim 15, further comprising a second photoelectric conversion element adjacent to the first photoelectric conversion element, wherein the second photoelectric conversion element functions as a light-blocking film.

* * * * *